(12) United States Patent
Nakamura et al.

(10) Patent No.: US 6,975,180 B2
(45) Date of Patent: Dec. 13, 2005

(54) SURFACE ACOUSTIC WAVE FILTER, AND ANTENNA DUPLEXER AND COMMUNICATION EQUIPMENT USING THE SAME

(75) Inventors: Hiroyuki Nakamura, Osaka (JP); Shun-ichi Seki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/635,004

(22) Filed: Aug. 6, 2003

(65) Prior Publication Data

US 2004/0061572 A1    Apr. 1, 2004

(30) Foreign Application Priority Data

Aug. 8, 2002 (JP) .............................. 2002-232053

(51) Int. Cl.[7] .............................. H03H 9/72; H03H 9/64
(52) U.S. Cl. ........................ 333/133; 333/193; 333/195
(58) Field of Search .............................. 333/193–196, 333/133; 310/313 B, 313 D

(56) References Cited

U.S. PATENT DOCUMENTS

| | | | | |
|---|---|---|---|---|
| 5,521,453 A | * | 5/1996 | Yatsuda ................. | 310/313 R |
| 5,694,096 A | * | 12/1997 | Ushiroku et al. ......... | 333/195 |
| 5,717,367 A | * | 2/1998 | Murai ................... | 333/195 |
| 6,057,744 A | * | 5/2000 | Ikada ................... | 333/133 |
| 6,339,365 B1 | * | 1/2002 | Kawase et al. ........... | 333/193 |
| 6,366,179 B1 | * | 4/2002 | Kuroda .................. | 333/133 |
| 6,380,827 B1 | * | 4/2002 | Noguchi ................. | 333/193 |
| 6,556,100 B2 | * | 4/2003 | Takamine ................ | 333/133 |
| 6,606,016 B2 | * | 8/2003 | Takamine ................ | 333/133 |

FOREIGN PATENT DOCUMENTS

| | | | |
|---|---|---|---|
| JP | 5-175879 | | 7/1993 |
| JP | 6-260876 | | 9/1994 |
| JP | 7-66679 | * | 3/1995 |
| JP | 9-083214 | | 3/1997 |
| JP | 10-107574 | * | 4/1998 |

OTHER PUBLICATIONS

P. A. Lorenz and D. F. Thompson, "Wide Bandwidth Low Cost Saw Notch Filters", 1998 IEEE Ultrasonics Symposium, pp. 51-55.

* cited by examiner

*Primary Examiner*—Barbara Summons
(74) *Attorney, Agent, or Firm*—Smith, Gambrell & Russell, LLP

(57) ABSTRACT

The present invention provides a surface acoustic wave filter and others that reduce ripples in a reception frequency band while ensuring sufficient attenuation in a transmission frequency band. A surface acoustic wave filter includes a surface acoustic wave resonator that allows a reception frequency band to pass while attenuating a transmission frequency band, and a surface acoustic wave filter connected in series with the surface acoustic wave resonator to allow the reception frequency band to pass while attenuating the transmission frequency band. An inductor is connected to one end of the surface acoustic wave resonator, a connection point between the surface acoustic wave filter and the surface acoustic wave resonator, and/or the other end of the surface acoustic wave resonator.

27 Claims, 26 Drawing Sheets

SEPARATE CHIP CONFIGURATION freq (700.0MHz to 1.100GHz)

SURFACE ACOUSTIC WAVE FILTER, AND ANTENNA DUPLEXER AND COMMUNICATION EQUIPMENT USING THE SAME

BACKGROUND OF THE INVENTION

1. Field of the Invention

The present invention relates to a surface acoustic wave filter, and an antenna duplexer and communication equipment using this surface acoustic wave filter.

2. Related Art of the Invention

FIG. 23 shows a reception frequency band (810 to 828 MHz) and a transmission frequency band (940 to 958 MHz) in a PDC system, a domestic digital cellular telephone system. This configuration employs a method of simultaneously carrying out transmissions and receptions in place of a conventional time division multiple access (TDMA). Thus, this configuration system requires an antenna switch. FIG. 25 is an example of a plan view of a longitudinal coupled mode type surface acoustic wave filter used as a reception filter in a PDC system used in the frequency bands mentioned above.

A surface acoustic wave filter 101, shown in FIG. 25, has IDT electrodes 103 to 105 and reflector electrodes 106 and 107 on a piezoelectric substrate 108. The IDT electrodes 103 to 105 each have a plurality of electrode fingers. An upper bus-bar side of the IDT electrode 103 is connected to a terminal 102. A lower bus bar side of each of the IDT electrodes 104 and 105 is connected to a second terminal 109. The lower bus bar side of the IDT electrode 103 and the upper bus-bar side of each of the IDT electrodes 104 and 105 are grounded.

FIG. 24 shows an attenuation characteristic 111 of the longitudinal coupled mode type surface acoustic wave filter 101 configured as described above. Further, a curve 112, shown in FIG. 24, shows the attenuation characteristic observed in the reception frequency band of the PDC (hereinafter simply referred to as the "reception frequency band"), the attenuation characteristic being enlarged in accordance with the scale on the right axis. As seen in FIG. 24, the attenuation in the transmission frequency band of the PDC (hereinafter simply referred to as the "transmission frequency band") is about −42 db. Such attenuation is not sufficient, so that transmission signals affect reception signals in an antenna duplexer.

FIG. 26 is a Smith chart showing an impedance characteristic as viewed from the terminal 102 of the surface acoustic wave filter 101. In FIG. 26, reference numeral 113 denotes an impedance characteristic at 950 MHz in the transmission frequency band. Reference numerals 114 and 115 denote impedance characteristics at 810 MHz and 828 MHz, respectively, in the reception frequency band.

FIG. 26 indicates that in the reception frequency band, the impedance characteristics are almost matched to each other but that in the transmission frequency band, the phase is not in its open position. If in the transmission frequency band, the phase is not in its open state, transmission signals may be lost in the antenna duplexer.

Thus, as shown in FIG. 27, the surface acoustic wave resonator 116 is cascaded between the terminal 102 and the surface acoustic wave filter 101. The surface acoustic wave resonator 116 has an IDT electrode 117 and reflector electrodes 118 and 119. The IDT electrode 117 is formed with a plurality of electrode fingers. An upper bus-bar side of the IDT electrode 117 is connected to the terminal 102. A lower bus bar side of the IDT electrode 117 is connected to an upper bus-bar side of the IDT electrode 103 of the surface acoustic wave filter 101.

FIG. 28 shows an attenuation characteristic 120 of the surface acoustic wave resonator 116. Further, a curve 121, shown in FIG. 28, shows this attenuation characteristic enlarged in accordance with the scale on the right axis. As seen in FIG. 28, the surface acoustic wave resonator 116 has an attenuation pole of about −20 dB in the transmission frequency band. Further, this figure indicates that insertion loss amount to about −0.7 dB in reception frequency bands denoted by R1 and R2. The surface acoustic wave resonator is advantageous in attenuating the vicinity of a pass band but insertion loss is degraded at a distance from the pass band. That is, it is preferable that the resonance frequency of the surface acoustic resonator is set near to the pass band of the longitudinal coupled mode type surface acoustic wave filter, and that the anti-resonance frequency of the surface acoustic resonator is set near to the attenuation band of the longitudinal coupled mode type surface acoustic wave filter. (for example, see Japanese Patent Laid-Open No. 6-260876. The entire disclosure of this document is incorporated herein by reference in its entirety). Such a insertion loss in the reception frequency band increases in a communication system such as a PDC system in which the transmission signal frequency band and the reception signal frequency band are separated from each other.

FIG. 29 shows the attenuation characteristics of a surface acoustic wave filter 130 constructed by cascading together the surface acoustic wave resonator 116 having such a characteristic as shown in FIG. 28 and the surface acoustic wave filter 101. The surface acoustic wave filter 130 enables an attenuation pole of about −62 dB to be formed in the transmission frequency band. Consequently, the antenna duplexer can sufficiently attenuate transmission signals in the transmission frequency band compared to a filter composed of the unitary surface acoustic wave filter 101, shown in FIG. 25.

Next, a surface acoustic wave filter 140, shown in FIG. 30, comprises the surface acoustic wave filter 130, shown in FIG. 27, and a surface acoustic wave resonator 131 cascaded to the surface acoustic wave filter 130. The surface acoustic wave resonator 131 has a configuration similar to that of the surface acoustic wave resonator 116 and has an IDT electrode 132 and reflector electrodes 133 and 134. The terminal 102 is connected to an upper bus-bar side of the IDT electrode 132. A lower bus bar side of the IDT electrode 132 is connected to an upper bus-bar side of the IDT electrode 117 of the surface acoustic wave resonator 116.

FIG. 31 shows the attenuation characteristic of the surface acoustic wave filter 140. FIG. 31 indicates that the attenuation in the transmission frequency band is larger. That is, this surface acoustic wave filter achieves much larger attenuation than the surface acoustic wave filter 130, shown in FIG. 27.

However, with the surface acoustic wave filter 130, shown in FIG. 27, a large ripple 200 occurs in the reception frequency band as shown in FIG. 29. Further, with the surface acoustic wave filter 140, shown in FIG. 30, a large ripple 210 occurs in the reception frequency band as shown in FIG. 31.

The presence of such a ripple in the reception frequency band increases insertion loss in this band. This is because owing to the characteristics of the surface acoustic wave resonators 116 and 131, if the transmission frequency band and the reception frequency band are separated from each other as in the case with the PDC, a heavy insertion loss occurs in the reception frequency band as shown in FIG. 28.

SUMMARY OF THE INVENTION

In view of these problems, it is an object of the present invention to provide a surface acoustic wave filter that reduces ripples in the reception frequency band while ensuring attenuation in the transmission frequency band, even if the transmission frequency band and the reception frequency band are separated from each other, as well as an antenna duplexer using this surface acoustic wave filter.

The $1^{st}$ aspect of the present invention is a surface acoustic wave filter, comprising:
at least one piezoelectric substrate;
at least one surface acoustic wave resonator formed on said piezoelectric substrate; and
a longitudinal coupled mode type surface acoustic wave filter formed on said piezoelectric substrate,
wherein said surface acoustic wave resonator and said longitudinal coupled mode type surface acoustic wave filter are cascaded together,
wherein said surface acoustic wave resonator is also connected to at least one inductor having one end grounded, and
wherein an attenuation band of said at least one surface acoustic wave resonator is apart from a pass band of said longitudinal coupled mode type surface acoustic wave filter in the direction of higher frequencies.

The $2^{nd}$ aspect of the present invention is a surface acoustic wave filter, comprising:
at least one piezoelectric substrate;
at least one surface acoustic wave resonator formed on said piezoelectric substrate; and
a longitudinal coupled mode type surface acoustic wave filter formed on said piezoelectric substrate,
wherein different electrode materials are used for said at least one surface acoustic wave resonator and for said longitudinal coupled mode type surface acoustic wave filter, respectively.

The $3^{rd}$ aspect of the present invention is the surface acoustic wave filter according to the $2^{nd}$ aspect of the present invention, wherein the electrode material of said at least one surface acoustic wave resonator has a stronger power durability than the electrode material of said longitudinal coupled mode type surface acoustic wave filter.

The $4^{th}$ aspect of the present invention is the surface acoustic wave filter according to the $3^{rd}$ aspect of the present invention, wherein said at least one surface acoustic wave resonator has a laminated electrode configuration.

The $5^{th}$ aspect of the present invention is the surface acoustic wave filter according to the $2^{nd}$ aspect of the present invention, wherein said surface acoustic wave resonator and said longitudinal coupled mode type surface acoustic wave filter are cascaded together,
wherein said surface acoustic wave resonator is also connected to at least one inductor having one end grounded.

The $6^{th}$ aspect of the present invention is the surface acoustic wave filter according to the $5^{th}$ aspect of the present invention, wherein the attenuation band of said at least one surface acoustic wave resonator is set to be higher than the pass band of said longitudinal coupled mode type surface acoustic wave filter.

The $7^{th}$ aspect of the present invention is the surface acoustic wave filter according to the $5^{th}$ aspect of the present invention, wherein the other end of said inductor is connected to a side of said surface acoustic wave resonator which is opposite said longitudinal coupled mode type surface acoustic wave filter.

The $8^{th}$ aspect of the present invention is the surface acoustic wave filter according to the $7^{th}$ aspect of the present invention, wherein a plurality of said surface acoustic wave resonators are cascaded together, and
wherein the side of said surface acoustic wave resonator which is opposite the longitudinal coupled mode type surface acoustic wave filter includes connection portions between said plurality of cascaded surface acoustic wave resonators.

The $9^{th}$ aspect of the present invention is the surface acoustic wave filter according to the the $4^{th}$ or the $5^{th}$ aspects of the present invention, wherein the other end of said inductor is connected to a connection portion between said surface acoustic wave resonator and said longitudinal coupled mode type surface acoustic wave filter.

The $10^{th}$ aspect of the present invention is the surface acoustic wave filter according to the $8^{th}$ aspect of the present invention, wherein a plurality of said inductors are provided, and each inductor is connected to said surface acoustic wave resonator through respective different connection portions.

The $11^{th}$ aspect of the present invention is the surface acoustic wave filter according to the $1^{st}$ or the $5^{th}$ aspects of the present invention, wherein said inductor moves a phase of an impedance at a frequency of said attenuation band closer to its open state.

The $12^{th}$ aspect of the present invention is the surface acoustic wave filter according to the $11^{th}$ aspect of the present invention, wherein said inductor matches impedances at a frequency of said pass band to each other.

The $13^{th}$ aspect of the present invention is the surface acoustic wave filter according to the $1^{st}$ or the $2^{nd}$ aspects of the present invention, wherein different electrode film thicknesses are used for said at least one surface acoustic wave resonator and for said longitudinal coupled mode type surface acoustic wave filter.

The $14^{th}$ aspect of the present invention is the surface acoustic wave filter according to the $1^{st}$ or the $2^{nd}$ aspects of the present invention, wherein a plurality of piezoelectric substrates are provided as said at least one piezolectric substrate, and
wherein the piezoelectric substrate on which said at least one surface acoustic wave resonator is formed is different from the piezoelectric substrate on which said longitudinal coupled mode type surface acoustic wave filter is formed.

The $15^{th}$ aspect of the present invention is the surface acoustic wave filter according to the $14^{th}$ aspect of the present invention, wherein at least one of said at least one surface acoustic wave resonator and said longitudinal coupled mode type surface acoustic wave filter is mounted in a face down manner.

The $16^{th}$ aspect of the present invention is the surface acoustic wave filter according to the $15^{th}$ aspect of the present invention, wherein the other of said at least one surface acoustic wave resonator and said longitudinal coupled mode type surface acoustic wave filter is mounted using wires.

The $17^{th}$ aspect of the present invention is the surface acoustic wave filter according to the $1^{st}$ or the $2^{nd}$ aspects of the present invention, wherein the attenuation band of said surface acoustic wave resonator is a transmission frequency band in a PDC system, and the pass band of said longitudinal coupled mode type surface acoustic wave filter is a reception band in the PDC system.

The 18$^{th}$ aspect of the present invention is an antenna duplexer, comprising:

an antenna terminal;

a reception filter connected to said antenna terminal;

a transmission filter connected to said antenna terminal; and a first phase circuit provided between said antenna terminal and said reception filter and/or a second phase circuit provided between said antenna terminal and said transmission filter, wherein the surface acoustic wave filter according to the 1$^{st}$ or the 2$^{nd}$ aspects of the present invention is used as said reception filter.

The 19$^{th}$ aspect of the present invention is the antenna duplexer according to the 18$^{th}$ aspect of the present invention, wherein all or part of said transmission filter is composed of a surface acoustic wave filter formed on a piezoelectric substrate.

The 20$^{th}$ aspect of the present invention is the antenna duplexer according to the 19$^{th}$ aspect of the present invention wherein said transmission filter is formed on the same piezoelectric substrate on which said surface acoustic wave resonator of said surface acoustic wave filter used as said reception antenna is formed.

The 21$^{st}$ aspect of the present invention is the antenna duplexer according to the 19$^{th}$ aspect of the present invention, wherein said at least one surface acoustic wave resonator and said transmission filter are mounted on the same package or the same mounting substrate, and said longitudinal coupled mode type surface acoustic wave filter is mounted on a package or mounting substrate different from said package or mounting substrate.

The 22$^{nd}$ aspect of the present invention is the antenna duplexer according to the 19$^{th}$ aspect of the present invention, wherein the surface acoustic wave resonator of said surface acoustic wave filter used as said reception filter and said transmission filter are formed on different piezoelectric substrates, and at least one of said surface acoustic wave resonator and said transmission filter is mounted in a face down manner.

The 23$^{rd}$ aspect of the present invention is the antenna duplexer according to the 22$^{nd}$ aspect of the present invention, wherein one of said surface acoustic wave resonator and said transmission filter is mounted in a face down manner, and the other is mounted face up for wire connection.

The 24$^{th}$ aspect of the present invention is the antenna duplexer according to the 19$^{th}$ aspect of the present invention, wherein a barrier is provided at a boundary between two areas of the package or mounting substrate on which said surface acoustic wave resonator of said surface acoustic wave filter used as said reception filter and said transmission filter are mounted, said surface acoustic wave resonator being mounted in one of the areas, said transmission filter being mounted in the other area.

The 25$^{th}$ aspect of the present invention is communication equipment comprising:

an antenna duplexer according to the 19$^{th}$ aspect of the present invention;

an antenna connected to said antenna duplexer;

transmission means connected to said antenna duplexer of transmitting a signal via said antenna; and reception means connected to said antenna duplexer of receiving a signal via said antenna.

According to the present invention, it is possible to provide a surface acoustic wave filter and others that reduce the ripple in the reception frequency band while ensuring attenuation in the transmission frequency band.

DESCRIPTION OF SYMBOLS 1, 11 Inductors
10, 20, 30, 40, 50, 60 Surface acoustic wave filters
101 Longitudinal coupled mode type surface acoustic wave filters
102, 109 Terminals
116 Surface acoustic wave resonator
117 IDT electrode

PREFERRED EMBODIMENTS OF THE INVENTION

Embodiments of the present invention will be described below with reference to the drawings.

Embodiment 1

Figure 1:
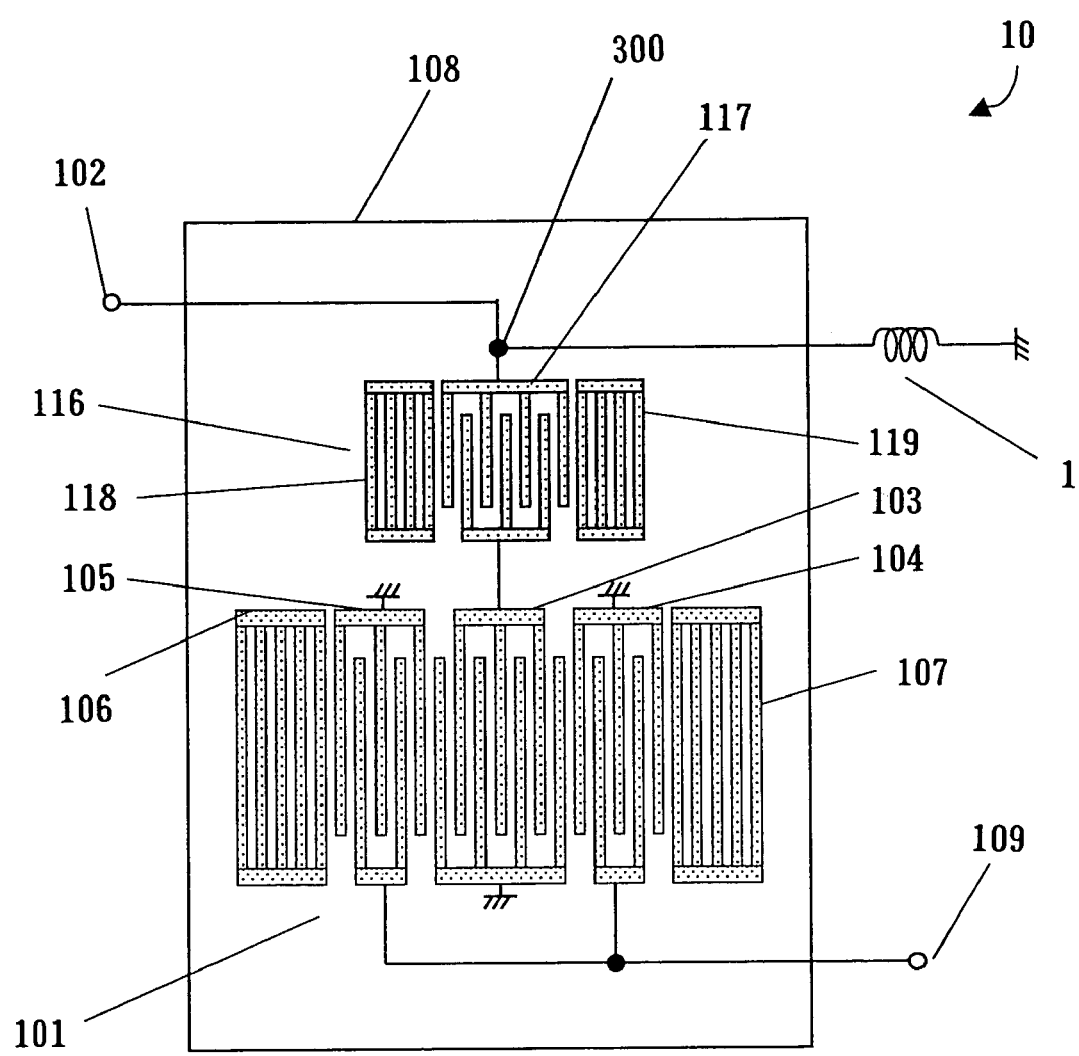
FIG. 1 is a plan view of a surface acoustic wave filter 101 according to Embodiment 1 of the present invention.
Figure 27:
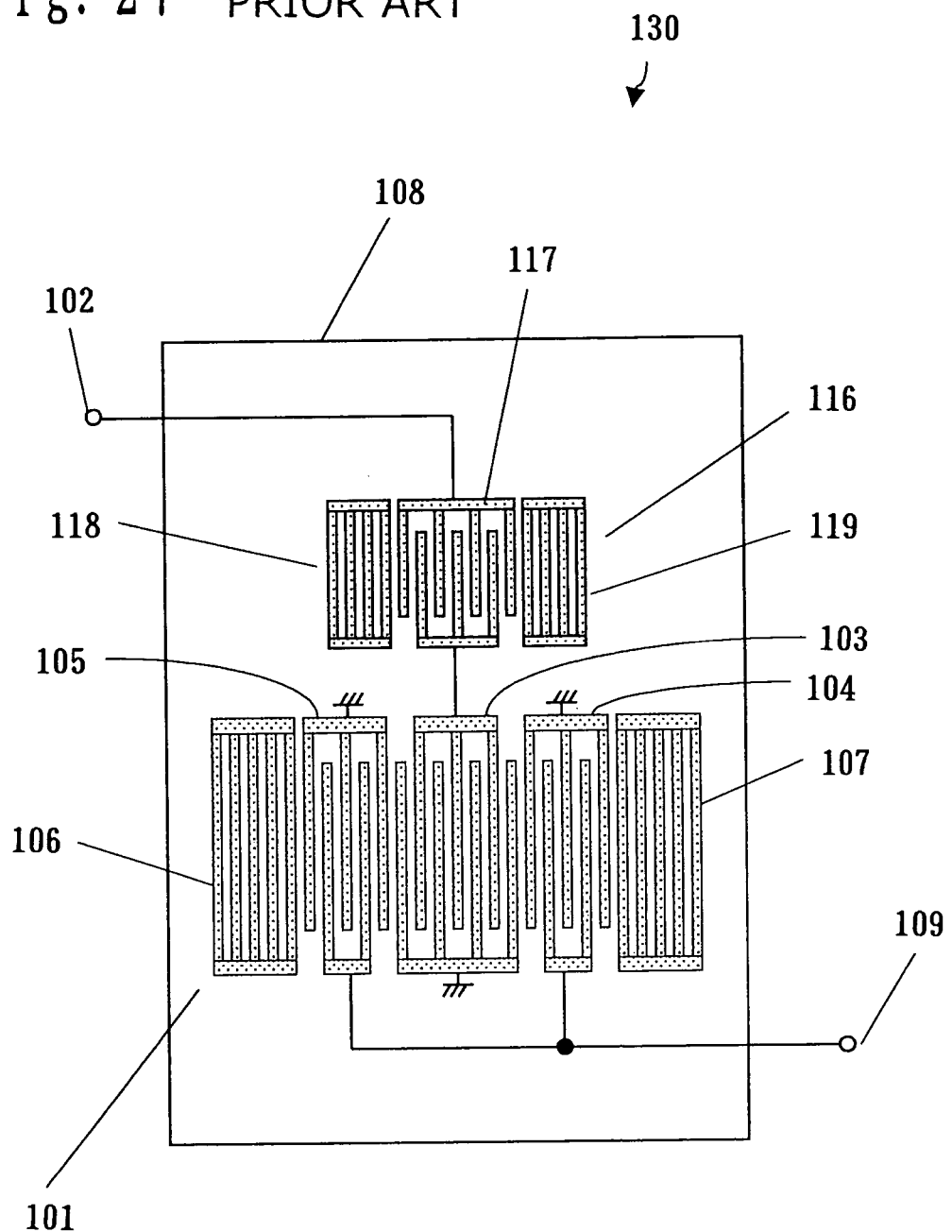
FIG. 27 is a plan view of a surface acoustic wave filter according to the prior art.

With reference to FIG. 1, description will be given of a configuration of a surface acoustic wave filter 10 according to Embodiment 1 of the present invention. In the surface acoustic wave filter 10, shown in FIG. 1, the same components as those of the conventional surface acoustic wave filter 130, shown in FIG. 27, are denoted by the same reference numerals. Their description is thus omitted.

The configuration of the surface acoustic wave filter 10 according to Embodiment 1 differs from the configuration of the conventional surface acoustic wave filter 130 in that a terminal 102 of a surface acoustic wave filter 116 is provided with an inductor 1 having one end grounded.

As shown in FIG. 1, the inductor 1 has one end connected to a connection point 300 between a bus bar side of an IDT electrode 117 and the terminal 102, and the other end grounded. That is, the inductor 1 is connected to an upper bus-bar side of the IDT electrode 117, i.e. a side at the connection point between the longitudinal coupled mode type surface acoustic wave filter 101 and the surface acoustic wave resonator 116 which is opposite the surface acoustic wave resonator 116.

The surface acoustic wave resonator 116 is an example of a surface acoustic wave resonator according to the present invention. The longitudinal coupled mode type surface acoustic wave filter 101 is an example of a longitudinal coupled mode type surface acoustic wave filter according to the present invention.

Figure 2:
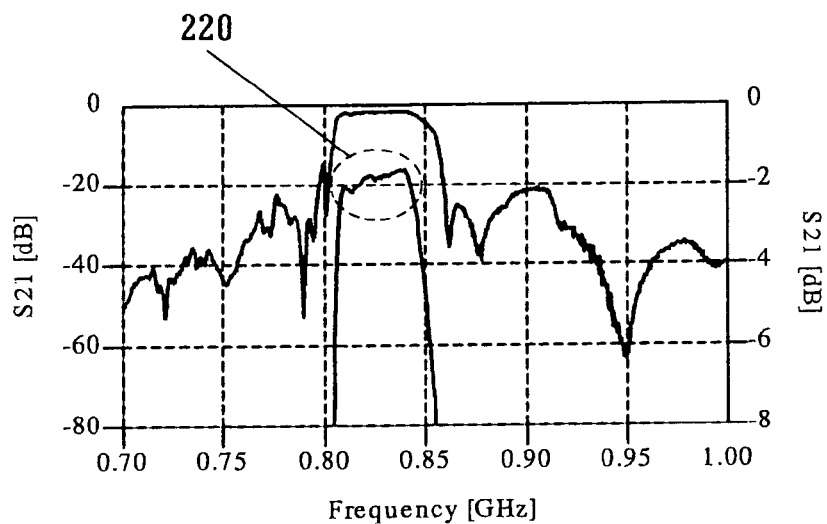
FIG. 2 is a chart showing the characteristics of the surface acoustic wave filter according to Embodiment 1 of the present invention.
Figure 29:
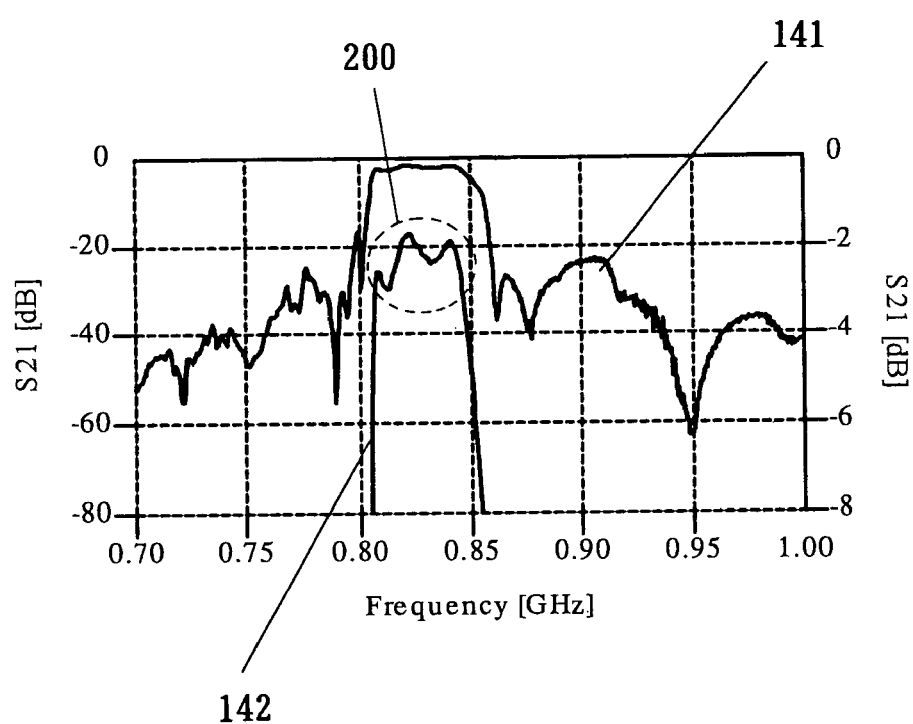
FIG. 29 is a chart showing the characteristics of the surface acoustic wave filter according to the prior art.

FIG. 2 shows the attenuation characteristic of the surface acoustic wave filter 10, comprising the inductor 1. A ripple 220 in the reception frequency band shown in FIG. 2 is smaller than the ripple 210, shown in FIG. 29. Consequently, the insertion loss in the reception frequency band has been reduced.

Figure 28:
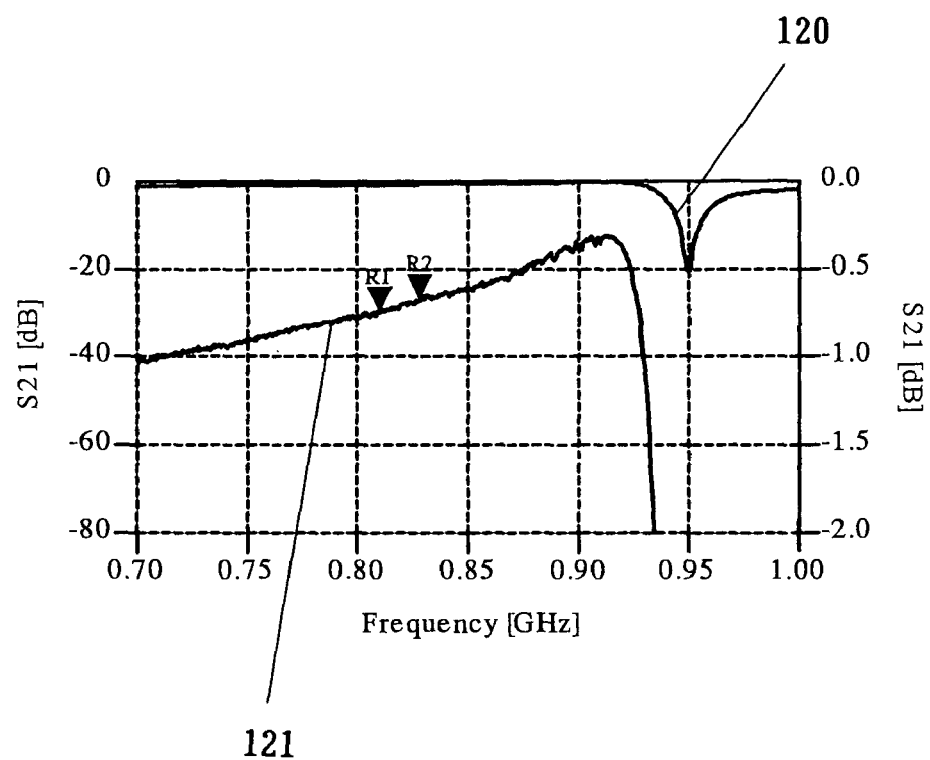
FIG. 28 is a chart showing the characteristics of a part of a configuration of the surface acoustic wave filter according to the prior art.

Here, description will be given of how a signal can be passed through a lower frequency band, while a higher frequency can be attenuated. In FIG. 28, an attenuation pole frequency is 950 MHz and corresponds to the antiresonant frequency of the surface acoustic wave resonator. The insertion loss in the pass band is minimized at about 920 MHz, which corresponds to the resonant frequency of the surface acoustic wave resonator.

In general, if a longitudinal coupled mode type surface acoustic wave filter is combined with a surface acoustic wave resonator, they are designed so that the pass band of the longitudinal coupled mode type surface acoustic wave filter is made almost equal or close to the resonant frequency of the surface acoustic wave resonator, i.e. the frequency at which the insertion loss is minimized.

However, in this case, as shown in FIG. 28, the pass band is between 810 MHz and 828 MHz, whereas the attenuation pole frequency is 950 MHz. That is, the pass band and the attenuation pole frequency are significantly apart from each other. In this case, the resonant frequency of the surface acoustic wave resonator, i.e. the frequency at which the insertion loss is minimized is apart from the pass band of the longitudinal coupled mode type surface acoustic wave filter, and be placed to the attenuation band of the longitudinal coupled mode type surface acoustic wave filter. Thus, a simple combination of the longitudinal coupled mode type surface acoustic wave filter with the surface acoustic wave resonator may degrade the characteristics of the whole filter. Here, when normalized using the attenuation pole frequency, the attenuation pole frequency and a higher frequency in the pass band are separated from each other by about 13%. Thus, the present arrangement is sufficiently effective on such a system.

Figure 3:
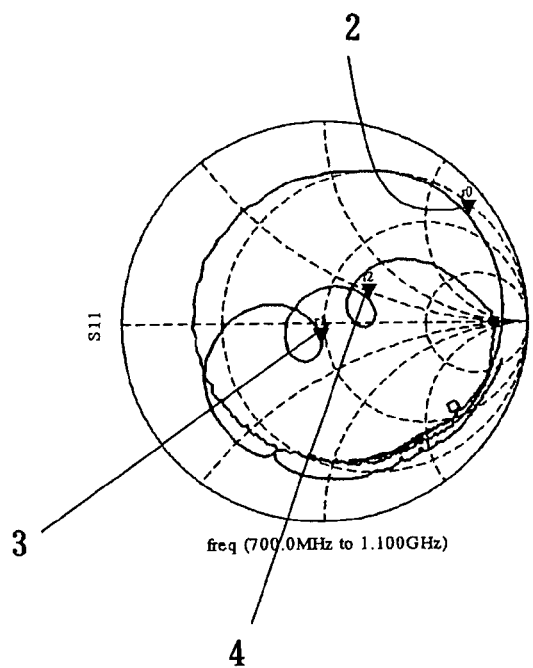
FIG. 3 is a chart showing the characteristics of the surface acoustic wave filter according to Embodiment 1 of the present invention.

FIG. 3 is a Smith chart showing the impedance characteristic of the surface acoustic wave filter 10 according to Embodiment 1 as viewed from the terminal 102. In FIG. 3, reference numeral 2 denotes an impedance characteristic at 95 MHz in the transmission frequency band. Reference numerals 3 and 4 denote the impedance characteristics of surface acoustic wave filter 10 at 810 MHz and 828 MHz, respectively, as viewed from the terminal 102. FIG. 3 indicates that the phase of the impedance is closer to its open state in the transmission frequency band, whereas the impedances are also matched to each other in the reception frequency band.

Thus, with the present surface acoustic wave filter 10 for the reception frequency band, the added inductor 1 allows the impedances in the reception frequency band to be matched to each other to reduce the ripple in the reception frequency band.

Figure 4:
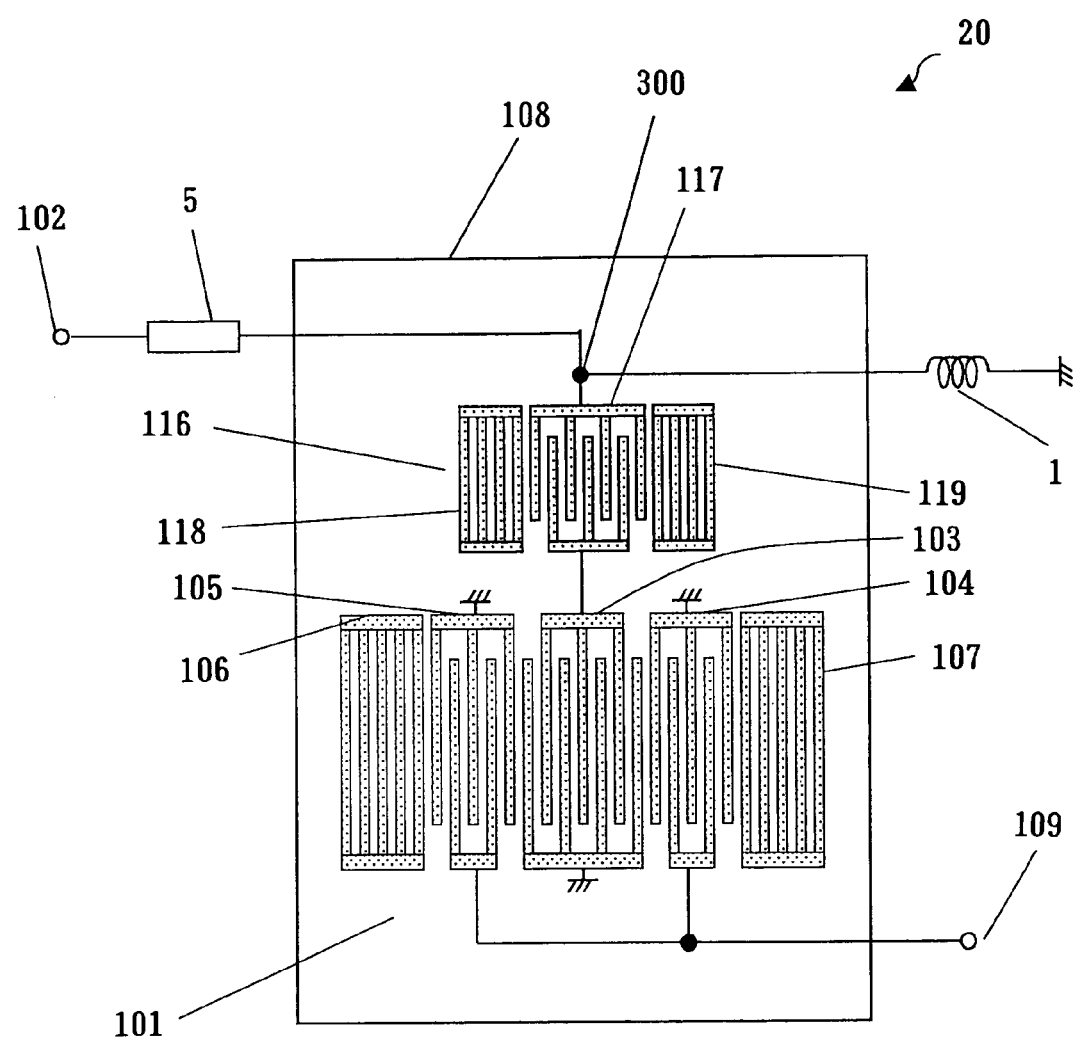
FIG. 4 is a plan view showing a variation of the surface acoustic wave filter according to Embodiment 1 of the present invention.

FIG. 4 shows a first variation of the surface acoustic wave filter according to Embodiment 1 of the present invention. A surface acoustic wave filter 20, shown in FIG. 4, comprises a transmission line 5 connected between the terminal 102 and the connection point 300. The transmission line 5 is formed as, for example, strip line on a substrate. The transmission line 5 has an impedance characteristic required to set the phase characteristic 2 in the transmission frequency band shown in FIG. 3 open state, in its open position (in this case, an impedance characteristic of about 20° phase-wise)

Figure 5:
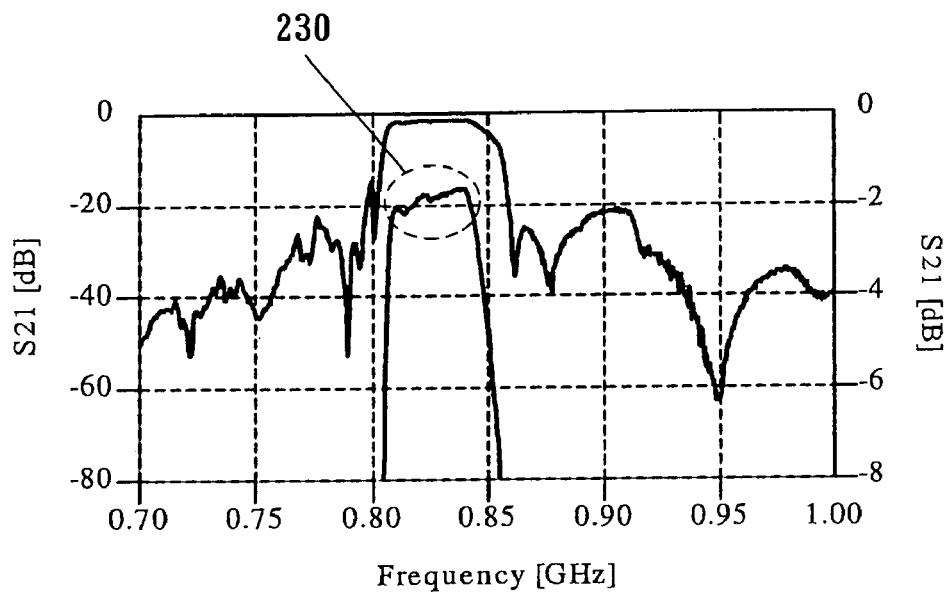
FIG. 5 is a chart showing the characteristics of the variation of the surface acoustic wave filter according to Embodiment 1 of the present invention.
Figure 6:
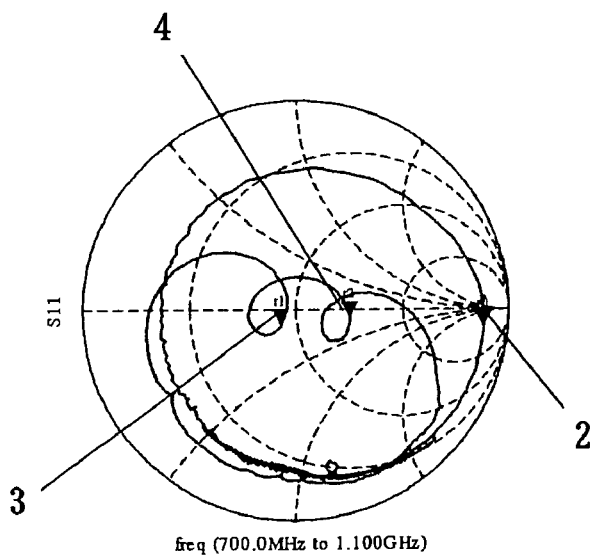
FIG. 6 is a chart showing the characteristics of the variation of the surface acoustic wave filter according to Embodiment 1 of the present invention.

The provision of the transmission line 5 results in such an impedance characteristic as shown in FIG. 6. This enables the phase characteristic 2 in the transmission frequency band to be placed in its open position. Further, FIG. 5 shows the attenuation characteristic of the surface acoustic wave filter 20, having the transmission line 5. A ripple 230 in FIG. 5 indicates that the ripple characteristic remains favorable even with the addition of the transmission line 5.

By thus additionally connecting the transmission line 5 in series with the surface acoustic wave filter 10, the phase characteristic in the transmission frequency band can be placed in its open position. Accordingly, if the surface acoustic wave filter 20 is utilized, for example, as a reception filter in the duplexer shown in FIG. 17(a), the impedance characteristic in the reception frequency band as viewed from the antenna is in its open position. It is thus possible to suppress an increase in the insertion loss in the transmission filter. This in turn enables transmission signals to be efficiently transmitted to the antenna.

Figure 7:
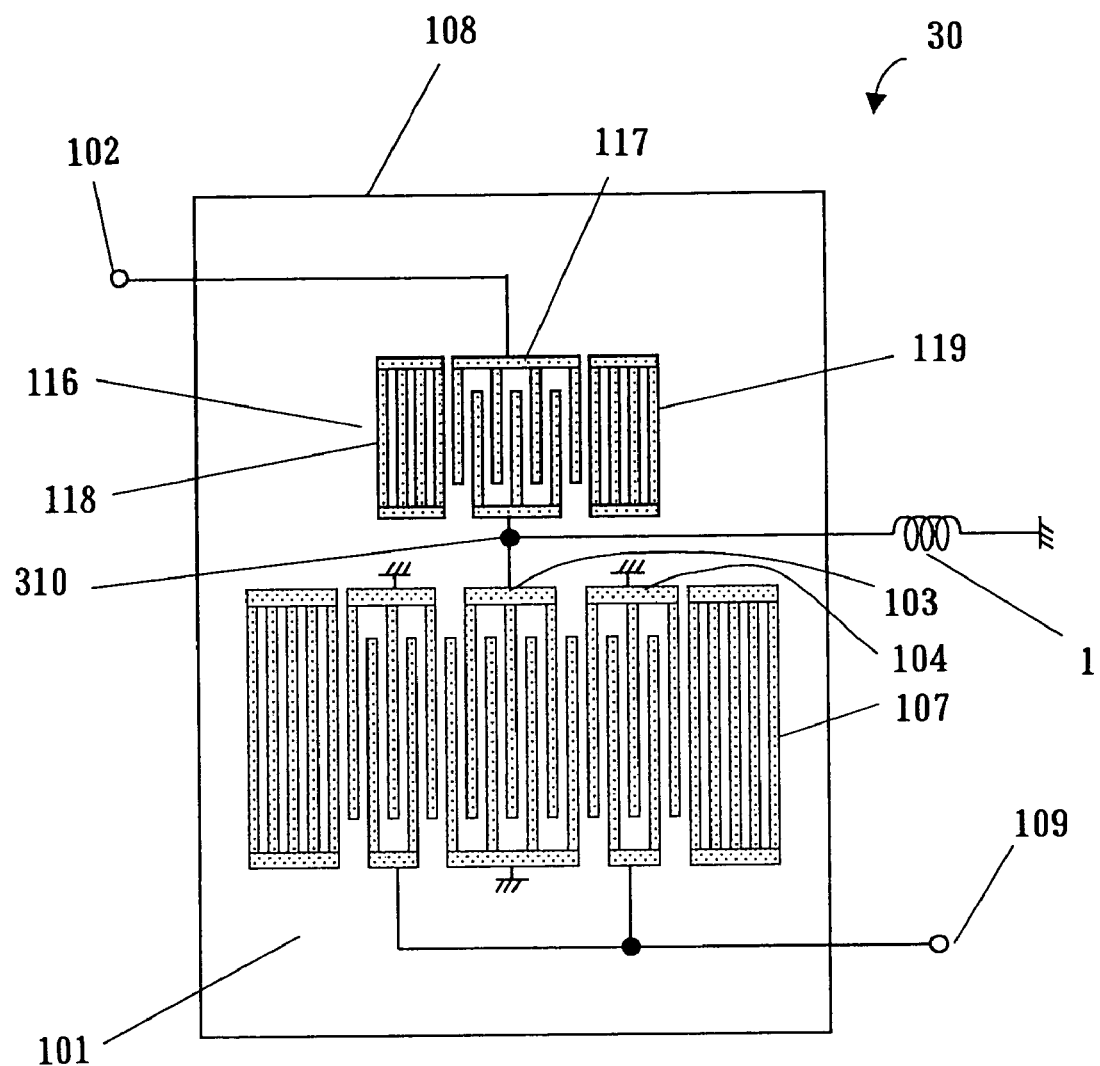
FIG. 7 is a plan view showing a variation of the surface acoustic wave filter according to Embodiment 1 of the present invention.

In the above description, the inductor 1 is connected to the connection point 300 between the upper bus bar of the IDT electrode 117 and the terminal 102. However, the inductor 1 may be connected to the connection point between the surface acoustic wave resonator 116 and the longitudinal coupled mode type surface acoustic wave filter 101. FIG. 7 shows that the inductor 1 is connected to a connection point 310 between a lower bus bar side of the IDT electrode 117 and an upper bus-bar side of the IDT electrode 103 of the longitudinal coupled mode type surface acoustic wave filter 101.

Figure 8:
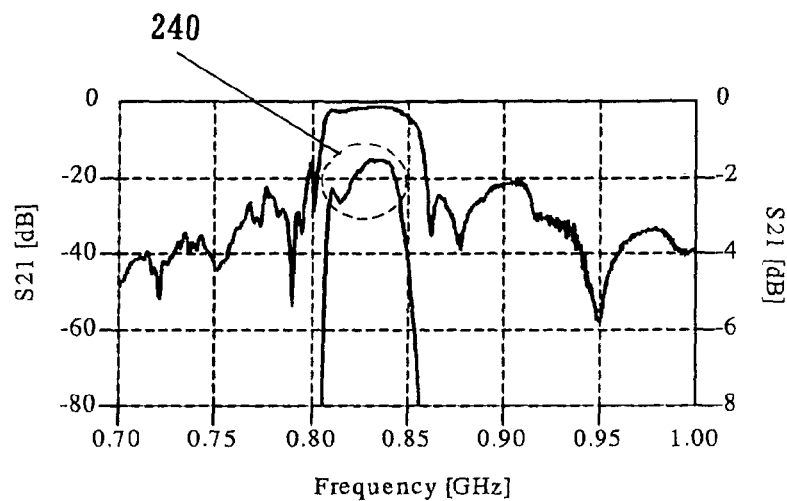
FIG. 8 is a chart showing the characteristics of the variation of the surface acoustic wave filter according to Embodiment 1 of the present invention.

FIG. 8 shows the attenuation characteristic of the surface acoustic wave filter 30, shown in FIG. 7. A comparison of a ripple 240, shown in FIG. 8, with a ripple 200, shown in FIG. 29, indicates that the surface acoustic wave filter 30, shown in FIG. 7, can also reduce the ripple in the reception frequency band.

Figure 9:
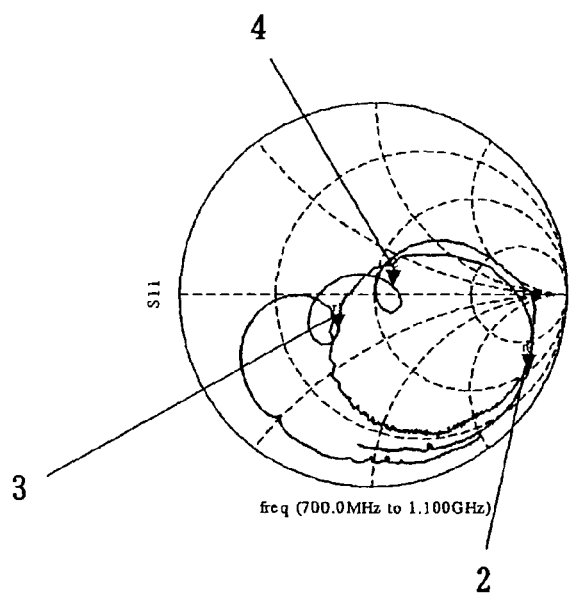
FIG. 9 is a chart showing the characteristics of the variation of the surface acoustic wave filter according to Embodiment 1 of the present invention.

FIG. 9 is a Smith chart showing the impedance characteristic of the surface acoustic wave filter 30, shown in FIG. 7. In this case, as shown in FIG. 9, the phase characteristic in the transmission frequency band can be moved closer to its open position.

Here, description will be given of the connection position relationship between the surface acoustic wave resonator and the inductor.

Figure 10:
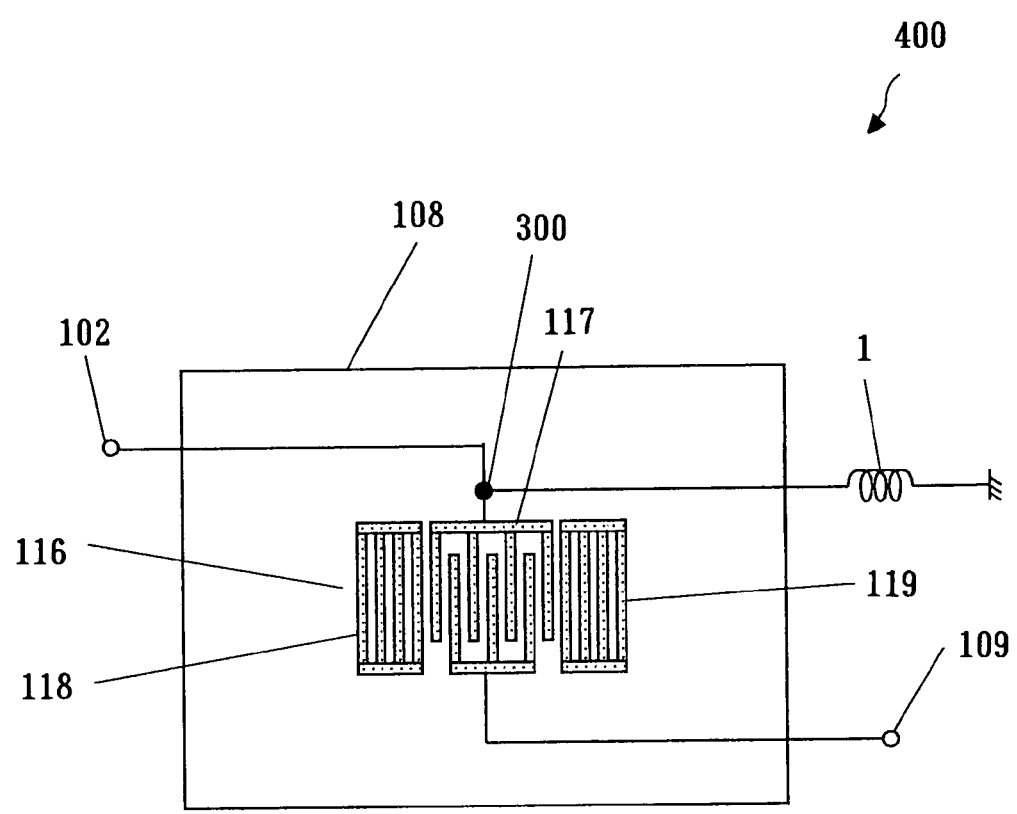
FIG. 10 is a plan view showing a configuration of a part of the surface acoustic wave filter according to Embodiment 1 of the present invention.

FIG. 10 shows a configuration of a unitary surface acoustic wave resonator 400 provided in the surface acoustic wave filter 10, shown in FIG. 1, and including the surface acoustic wave resonator 116 and the inductor 1.

Figure 11:
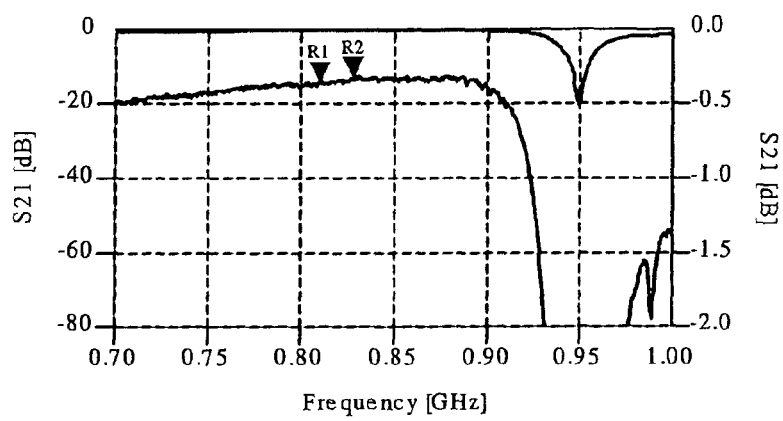
FIG. 11 is a chart showing the characteristics of the configuration of the part of the surface acoustic wave filter according to Embodiment 1 of the present invention.

Further, FIG. 11 shows the pass characteristic of the unitary surface acoustic wave resonator 400. When FIG. 11 is compared with the pass characteristic of the conventional surface acoustic wave resonator 116, shown in FIG. 28, it is understood that the resonator to which the inductor 1 is connected reduces the insertion loss in the reception frequency band compared to the unitary surface acoustic wave resonator 116, to which the inductor 1 is not connected. Accordingly, the pass characteristic has been improved.

Figure 12:
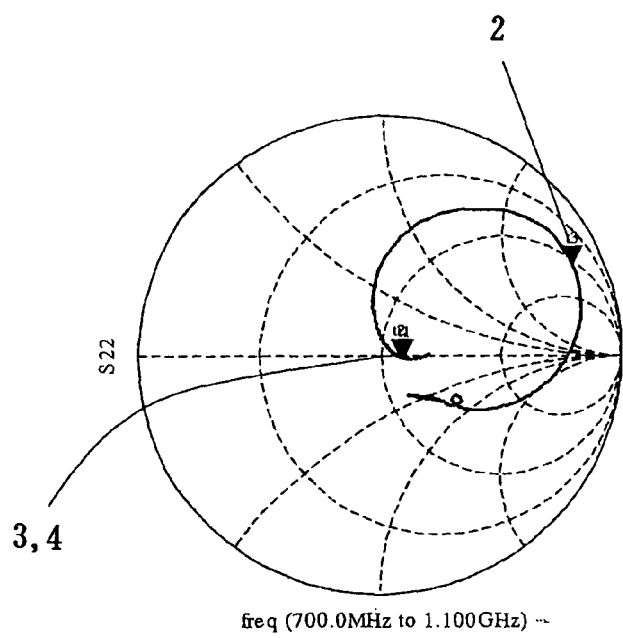
FIG. 12 is a chart showing the characteristics of the configuration of the part of the surface acoustic wave filter according to Embodiment 1 of the present invention.

FIG. 12 is a Smith chart showing the impedance characteristic of the unitary surface acoustic wave resonator 400 as viewed from the terminal 102. Further, FIG. 13 shows the impedance characteristic as viewed from the terminal 109.

Figure 13:
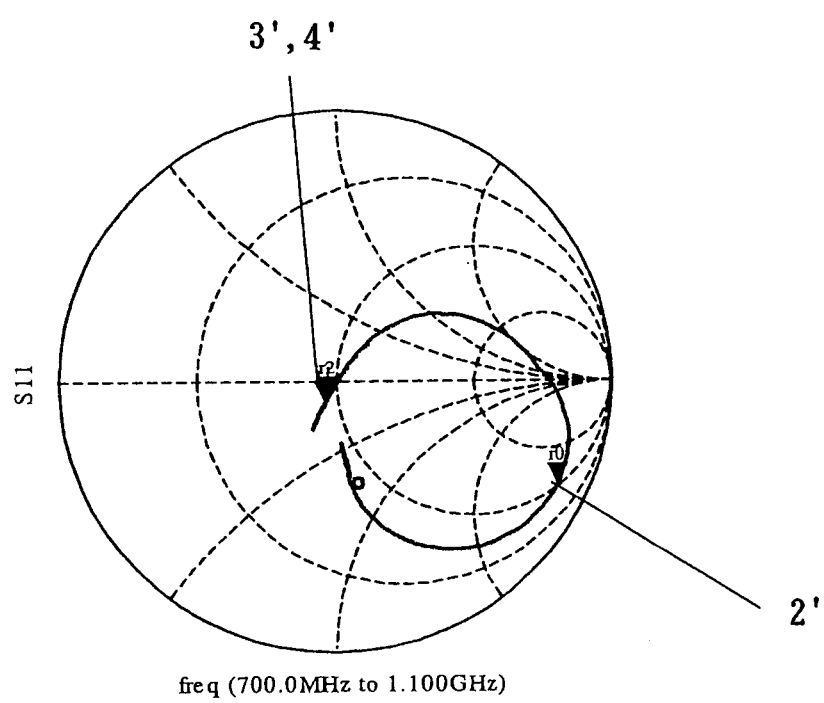
FIG. 13 is a chart showing the characteristics of the configuration of the part of the surface acoustic wave filter according to Embodiment 1 of the present invention.

A comparison of FIG. 12 with FIG. 13 indicates that in the reception frequency band, both the phase characteristics 3 and 4 and phase characteristics 3' and 4' have their impedance characteristics matched to each other.

On the other hand, in the transmission frequency band, the phase characteristic 2 at a transmission frequency of 950 MHz, shown in FIG. 12, is inductive, whereas a phase characteristic 2' at a transmission frequency of 950 MHz, shown in FIG. 13, is capacitive. Accordingly, as shown in FIG. 4, when the transmission line 5 is used to set the phase characteristic in the transmission frequency band open state, if the inductor is connected to the lower bus bar side of the IDT electrode 117, then a longer transmission line 5 is required. Therefore, to place the impedance characteristic as viewed from the antenna in its open position, it is desirable that the inductor 1 be connected to the upper bus-bar side of the IDT electrode 117.

The inductor 1 may be connected to both the connection point 300 on the upper bus-bar side of the IDT electrode 117 and the connection point 310 on the lower bus bar side provided as long as it can match the impedance characteristics in the reception frequency band to each other. In this case, effects similar to those described above are produced. Further, as shown in FIG. 11, even if when normalized using the attenuation pole frequency, the attenuation pole frequency and a higher frequency in the pass band are separated from each other by 7% or more, then even at about 880 MHz, the insertion loss in the surface acoustic wave resonator is reduced from the minimum value by 0.2 dB or more. Therefore, the application of the configuration of the present invention is sufficiently effective. That is, in the case that the resonance frequency of the surface acoustic resonator is placed to higher frequencies side of the attenuation band of the longitudinal coupled mode type surface acoustic wave filter, the application of the configuration of the present invention is sufficiently effective.

Embodiment 2

Figure 14:
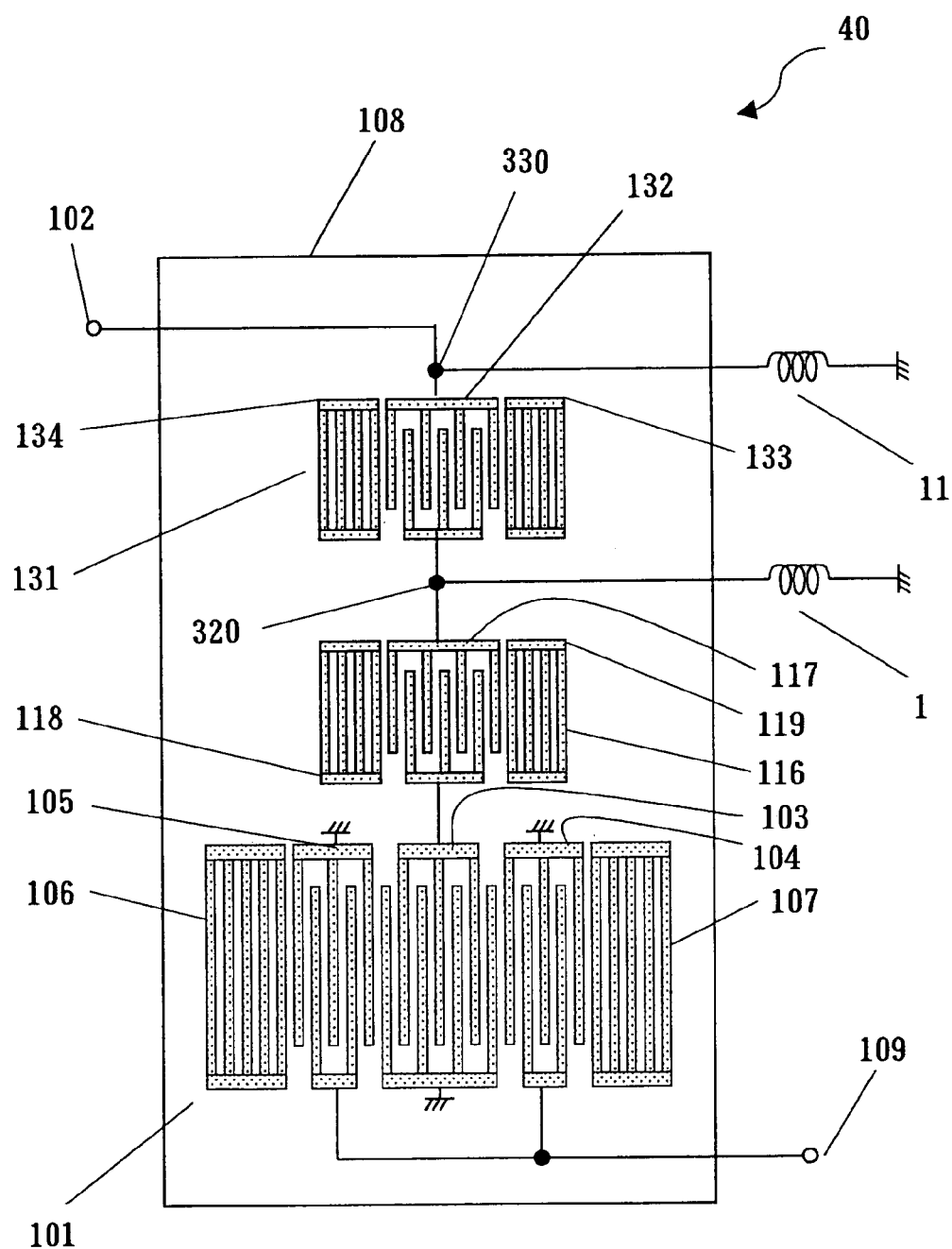
FIG. 14 is a plan view of a surface acoustic wave filter 101 according to Embodiment 2 of the present invention.

FIG. 14 is a plan view showing a surface acoustic wave filter 40 according to Embodiment 2 of the present invention. Components of the surface acoustic wave filter 40 that are the same as or correspond to those in FIG. 1 are denoted by the same reference numerals. Their detailed description is omitted. The surface acoustic wave filter 40, shown in FIG. 14, comprises the longitudinal coupled mode type surface acoustic wave filter 101 of the surface acoustic wave filter 10 according to Embodiment 1, as well as a surface acoustic wave resonator 131 further cascaded to the surface acoustic wave resonator 116, the inductor 1 having one end grounded and provided at a connection point 320 between the surface acoustic wave resonator 116 and a surface acoustic wave resonator 131, and an inductor 11 having one end grounded and provided at a connection point 330 between the terminal 102 and the surface acoustic wave resonator 131. That is, the present embodiment differs from Embodiment 1 in that the surface acoustic wave resonators each having one end grounded are cascaded together so as to form two-stages.

Figure 15:
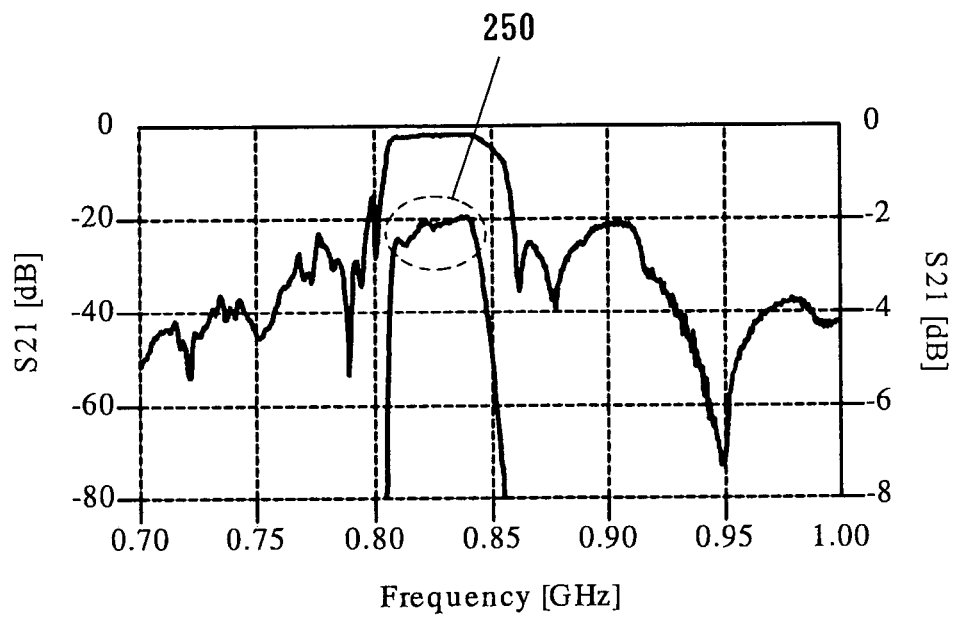
FIG. 15 is a chart showing the characteristics of the surface acoustic wave filter according to Embodiment 2 of the present invention.
Figure 31:
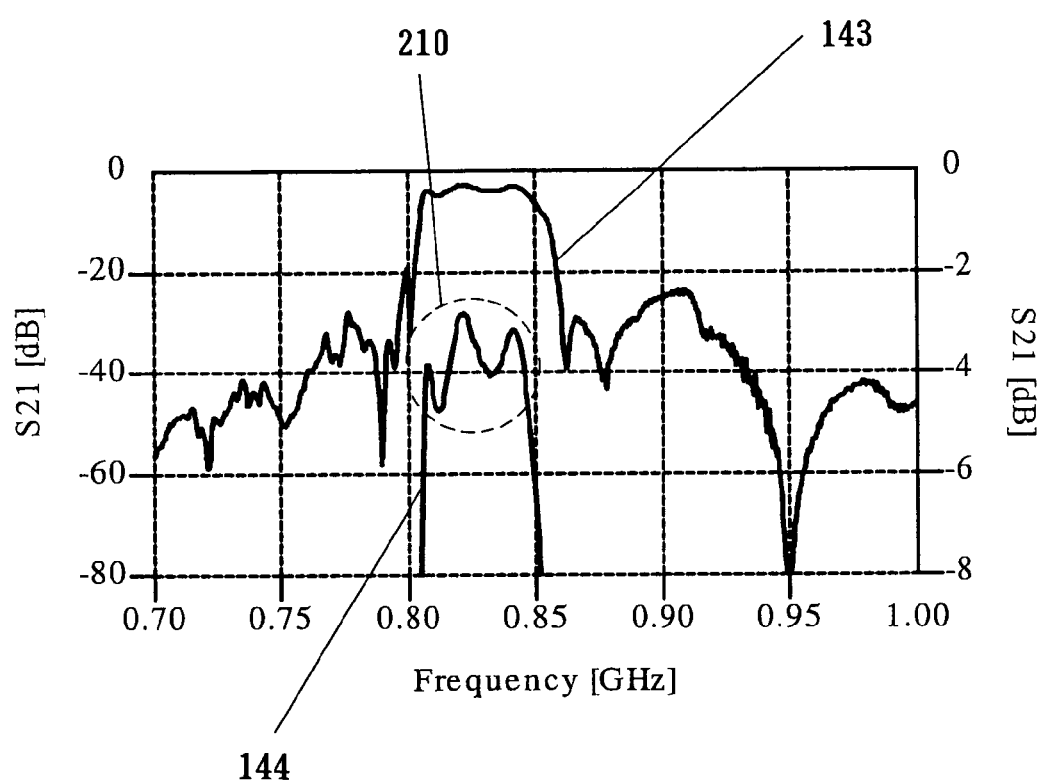
FIG. 31 is a chart showing the characteristics of the surface acoustic wave filter according to the prior art.

FIG. 15 shows the attenuation characteristic of the surface acoustic wave filter 40 configured as described above. This figure indicates that the surface acoustic wave filter 40 enables the ripple 250 in the reception frequency band to be sharply small. Further, the insertion loss in the reception frequency band has been improved compared to the surface acoustic wave filter 140 of the prior art, shown in FIG. 31.

Figure 16:
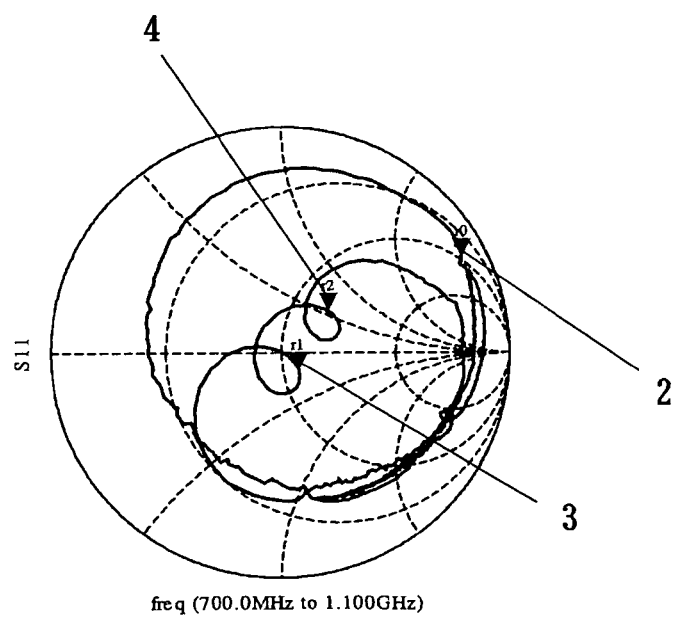
FIG. 16 is a chart showing the characteristics of the surface acoustic wave filter according to Embodiment 2 of the present invention.

FIG. 16 shows the impedance characteristic of the surface acoustic wave filter 40 according to the present embodiment as viewed from the terminal 102. FIG. 16 indicates that the impedance characteristics in the reception frequency band are matched to each other. Further, the phase characteristic in the transmission frequency band is close to its open state on the inductive side. Consequently, as in the case with the configuration shown in FIG. 4, the phase characteristic can be easily adjusted to its open position by inserting the transmission line 5 between the terminal 102 and the surface acoustic wave resonator 133.

In the present embodiment, the inductor 1 is connected to the connection point 320 between the surface acoustic wave resonator 116 and the surface acoustic wave resonator 131. Further, the inductor 11 is connected to the connection point 330 between the terminal 102 and the surface acoustic wave resonator 131. As in the case with the configuration shown in FIG. 7, a new inductor having one end grounded may be connected to the connection point between the surface acoustic wave resonator 116 and the longitudinal coupled mode type surface acoustic wave filter 101. Furthermore, the inductors need not be connected to all the connection points but may be connected only to some of the connectors.

Further, the surface acoustic wave filter 40 according to the present embodiment comprises the surface acoustic wave resonators 116 and 133, cascaded together so as to form two-stages and each having one end grounded. However, the surface acoustic wave filter 40 may comprise three or more surface acoustic wave resonators cascaded together so as to form three-or more multiple-stages. In this case, the inductor has only to be connected to at least one of the connection point between the surface acoustic wave resonators, the connection point between the surface acoustic wave resonator and the longitudinal coupled mode type surface acoustic wave filter, and the connection point between the terminal 102 and the surface acoustic wave resonator. In this case, effects similar to those described above can be produced.

Further, in Embodiments 1 and 2, described above, the connection points 300, 310, 320, 330 and other connection points are examples of connection portions of the present invention. However, the connection portion according to the present invention may be an arbitrary part of an electric path connecting the surface acoustic wave resonators together, the surface acoustic wave resonator and the longitudinal coupled mode type surface acoustic wave filter together, or the terminal 102 and the surface acoustic wave resonator together. Thus, the connection portion is not limited by the specific position or size of the actual connection point.

Embodiment 3

Figure 17:
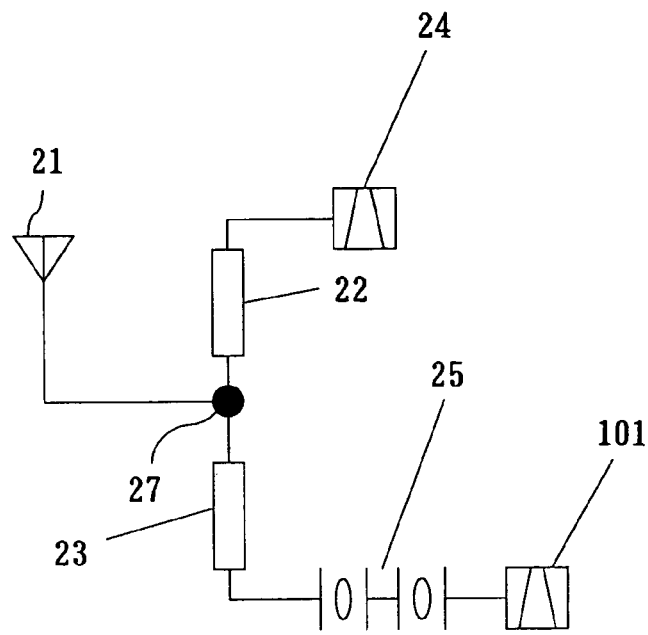
FIG. 17(a) is a block chart showing a configuration of an antenna duplexer that uses a surface acoustic wave filter according to Embodiment 3 of the present invention.
FIG. 17(b) is a chart showing a configuration of electrodes of a resonator 25 in the surface acoustic wave filter according to Embodiment 3 of the present invention.
FIG. 17(c) is a chart showing a configuration of the electrodes of the resonator 25 in the surface acoustic wave filter according to Embodiment 3 of the present invention.
FIG. 17(d) is a chart showing a configuration of the electrode of the resonator 25 in the surface acoustic wave filter according to Embodiment 3 of the present invention.
Figure 17:
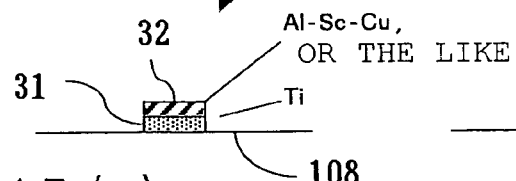
Figure 17:
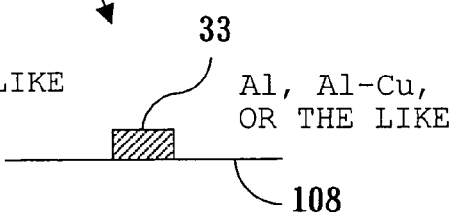
Figure 17:
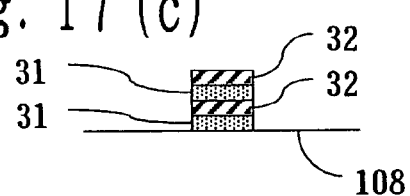

FIG. 17(*a*) is a block diagram showing a surface acoustic wave filter according to Embodiment 3 of the present invention and an antenna duplexer using the surface acoustic wave filter. In FIG. 17(*a*), a resonator 25 is the surface acoustic wave resonator 116 according to Embodiment 1 or 2 or a series circuit comprising the surface acoustic wave resonator 116 and the surface acoustic wave resonator 131. An output side of the resonator 25 is connected to the longitudinal coupled mode type surface acoustic wave filter 101. An input side of the resonator 25 is connected to one end of a phase circuit 23 as an example of a first phase circuit according to the present invention. The other end of the phase circuit 23 is connected via an antenna terminal 27 to an antenna 21 and one end of a phase circuit 22 as an example of a second phase circuit according to the present invention. The other end of the phase circuit 22 is connected to one end of a transmission filter 24. Reception means (not shown) is connected to the other end of the longitudinal coupled mode type surface acoustic wave filter 101. A transmission means (not shown) is connected to the other end of the transmission filter 24.

In the present embodiment, electrode portions constituting the resonator 25 are each composed of a power durable material. FIGS. 17(*b*) and 17(*c*) show an example in which each electrode portion is composed of a power durable material.

As shown in FIG. 17(*b*), each electrode portion of the resonator 25 is formed of an electrode layer 31 formed on a surface of a piezoelectric substrate 108 and an electrode layer 32 composed of Ti and Al—Sc—Cu layers, or the like laminated on the electrode layer 31.

Alternatively, as shown in FIG. 17(*c*), further electrode layers 31 and 32 may be stacked so as to form, for example, four layers.

On the other hand, the electrodes 33 of the longitudinal coupled mode type surface acoustic wave filter 101 are formed of Al, Al—Cu, or the like, which is a common electrode material that is not durable to power as shown in FIG. 17(*d*).

An increase in insertion loss can be suppressed by thus using a power durable material for the corresponding portions of the resonator 25 to form the electrodes and using a common electrode material for the longitudinal coupled mode type surface acoustic wave filter 101. The reason will be described below.

Since the surface acoustic wave filter has an insufficient power durability, it has hitherto been made of the above described power durable material. This also applies to the conventional configuration shown in FIG. 27 in which the longitudinal coupled mode type surface acoustic wave filter 101 and the surface acoustic wave resonator 116 are cascaded together. Electrode fingers and bus bars in various portions are made of a power durable material.

However, the above described power durable material has a larger durability than the common electrode material such as Al or Al—Cu. Accordingly, if such a power durable material is used for the above antenna duplexer, the insertion loss on the receiving side increases slightly.

Thus, by using a power durable material for the electrode portions of the resonator 25 and using a normal electrode material for the longitudinal coupled mode type surface acoustic wave filter 101, the insertion loss in reception power can be minimized while suppressing the adverse effects of the originating side on the receiving side.

Figure 32:
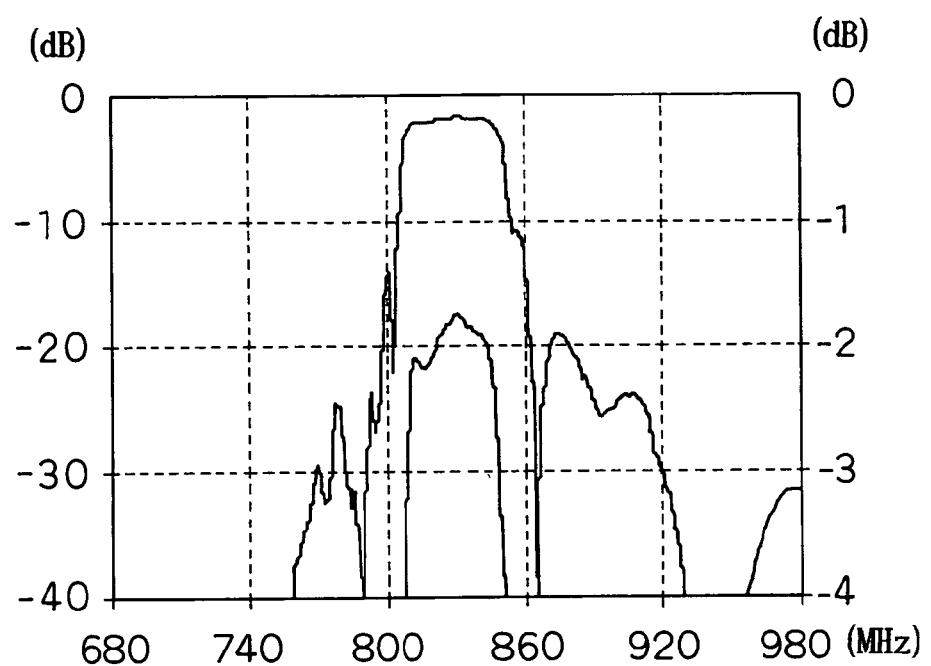
FIG. 32 is a chart showing the pass characteristic of a surface acoustic wave filter according to the prior art.
Figure 33:
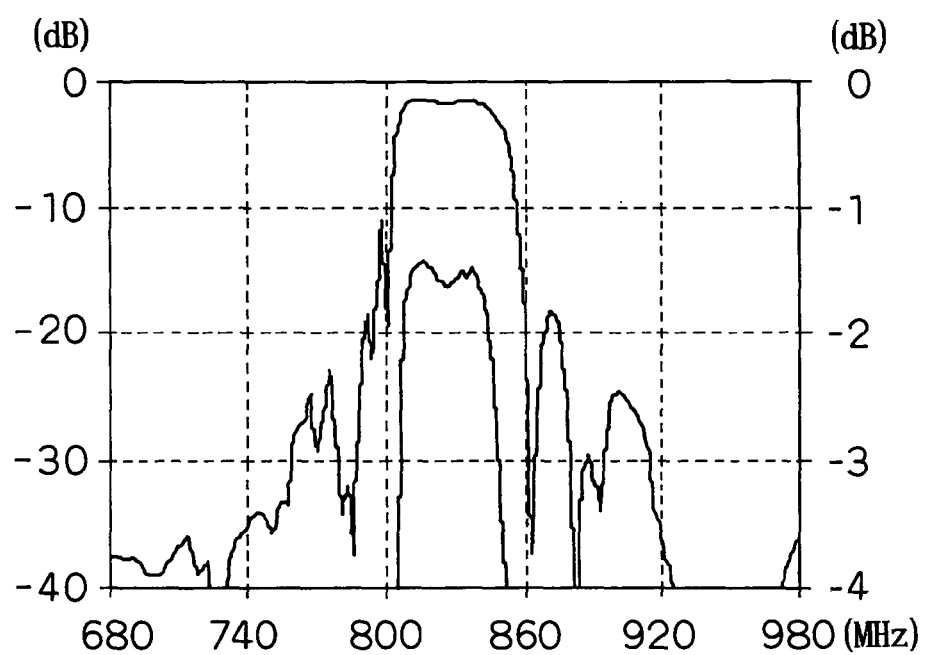
FIG. 33 is a chart showing the pass characteristic of a surface acoustic wave filter according to Embodiment 3 of the present invention.

Here, FIGS. 32 and 33 show a comparison of the characteristics of the configuration of the present embodiment in which different materials are used for the surface acoustic wave resonator and for the longitudinal coupled mode type surface acoustic wave filter with the characteristics of a conventional example in which the same power durable material is used for both the surface acoustic wave resonator and the longitudinal coupled mode type surface acoustic wave filter.

FIG. 32 shows the pass characteristic of a reception filter in the conventional example. This characteristic involves a phase circuit. Stacked electrodes are used: Al-Sc—Cu (1570 Å)/Ti (200 Å)/Al-Sc—Cu (1570 Å)/Ti (200 Å). The addition of a mass corresponds to approximately 3900 Å in Al-Cu electrode equivalent. Although not shown, in a package of the filter, the terminals are arranged so that GND is located between the terminal 102 and each connection point of the inductor in order to ensure isolation.

FIG. 32 indicates that isolation is ensured but that the insertion loss increases to 2.5 dB, thus degrading the characteristics. This corresponds to a grater insertion loss by 0.7 dB compared to the reception filter with the Al-Cn electrodes of a smaller power durablility according to the present embodiment, shown in FIG. 33. This is not due to a matching insertion loss because the impedance outside the pass band is almost 50 Ω but due to degradation caused by the durability of the electrodes.

In particular, as described above, the longitudinal coupled mode type surface acoustic wave filter is adapted to have a smaller number of IDT electrodes and a larger overlapping width than an SAW resonator used as a notch filter. Specifically, the IDT electrodes of the surface acoustic wave resonator have about 100 pairs of electrode fingers, whereas the IDT electrodes of the longitudinal coupled mode type surface acoustic wave filter have a relatively few, about 15 to 20 pairs of electrode fingers. Further, in the latter case, the electrode fingers have a smaller overlapping width.

Thus, the degradation is caused by an increase in insertion loss associated with the durability components of the IDT electrodes. Further, provided that the surface acoustic wave resonator achieves sufficient attenuation, the power durability of the longitudinal coupled mode type surface acoustic wave filter is sufficient.

As described above, in the configuration according to the present embodiment, the different materials are used for the surface acoustic wave resonator and for the longitudinal coupled mode type surface acoustic wave filter. This makes it possible to suppress the insertion loss while ensuring a sufficient power durability.

In the present embodiment, the materials shown as the power durable materials are only examples. Other materials may be used provided that they have a larger power durability than the electrode material used for the longitudinal coupled mode type surface acoustic wave filter 101. Further, for the materials shown as the normal electrode materials, other electrode materials may be used provided that they have a sufficiently small specific durability (further, the electrodes composed of a power durable material need not have a stacked configuration).

Furthermore, if the resonator 25 is composed of a plurality of surface acoustic wave resonators, some of the surface acoustic wave resonators which are close to the antenna terminal may be formed of a normal electrode material similar to that of the longitudinal coupled mode type surface acoustic wave filter 101. Taking by way of example the configuration comprising the surface acoustic wave resonators 131 and 116 as shown in FIG. 14, each electrode of the surface acoustic wave resonator 131 is composed of a power durable material, while each electrode of the surface acoustic wave resonator 116 is composed of a normal electrode material. In this case, effects similar to those described above can be produced. If a plurality of surface acoustic wave resonators are used, they are preferably formed of a normal electrode material in sequence starting with the one located closest to the longitudinal coupled mode type surface acoustic wave filter 101.

Further, each of the phase circuits 22 and 23, including even the related transmission line, may be formed of a combination of an inductor and a capacitor.

Furthermore, the antenna terminal 27 maybe located inside a switch element composed of a semiconductor. Moreover, the configuration of the stacked electrode is not limited to the examples shown in FIGS. 17(b) to 17(d). Any antenna terminal can be provided regardless of its material, the number of stacked layers, or the order of stacked materials as long as it has a desired power durability characteristic.

Figure 30:
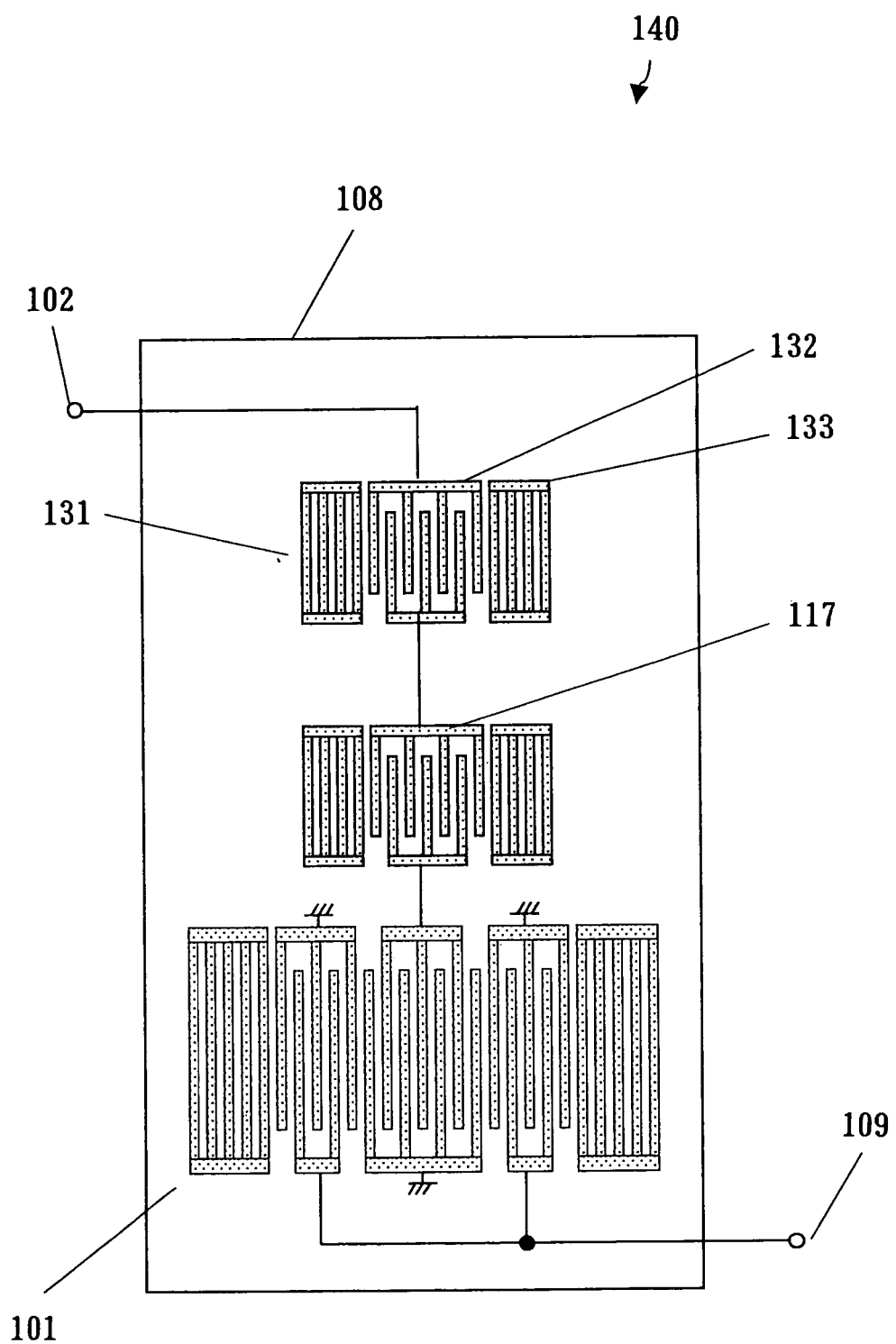
FIG. 30 is a plan view of a surface acoustic wave filter according to the prior art.

Further, the configuration of the electrode material according to the present embodiment may be implemented in the surface acoustic wave filter comprising the inductor 1 or 11 according to Embodiment 1 or 2, or the like. Alternatively, it may be implemented in a surface acoustic wave filter having a configuration similar to that of the conventional example shown in FIG. 27 or 30 and having no inductors.

Embodiment 4

Figure 18:
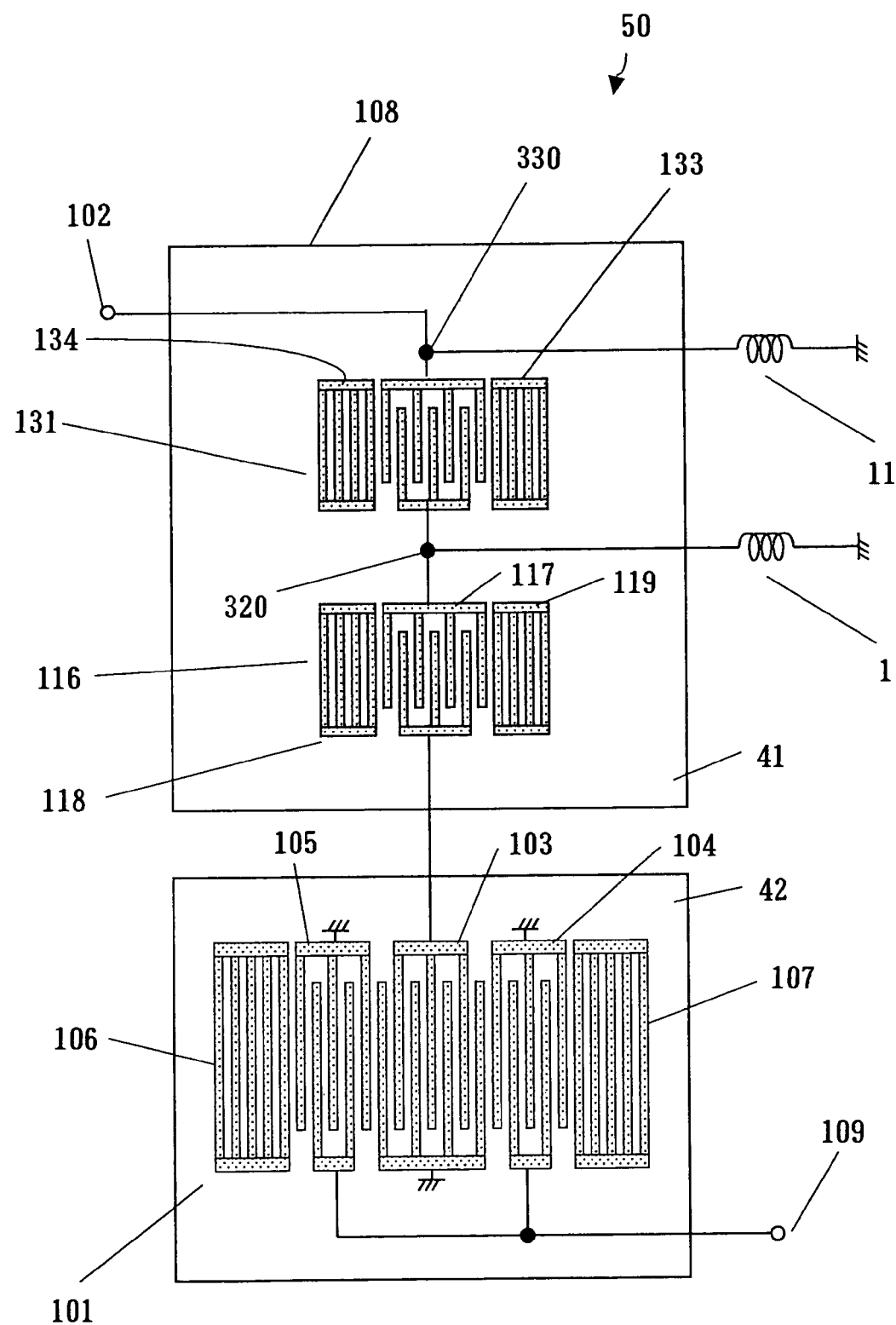
FIG. 18 is a plan view showing a configuration of a surface acoustic wave filter according to Embodiment 4 of the present invention.

FIG. 18 is a plan view of a surface acoustic wave filter according to Embodiment 4 of the present invention. Components of this surface acoustic wave filter that are the same as or correspond to those in FIG. 14 are denoted by the same reference numerals. Their detailed description is omitted.

Figure 19:
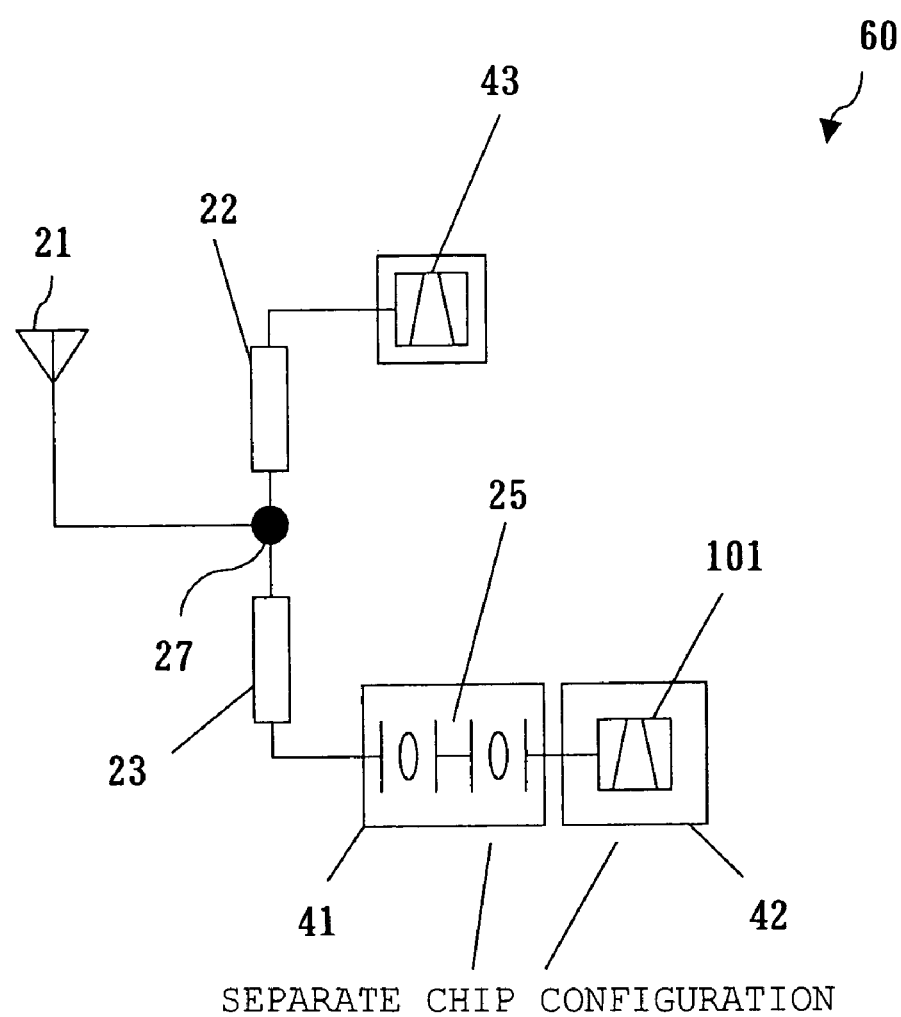
FIG. 19 is a block chart showing that the surface acoustic wave filter according to Embodiment 4 of the present invention is used as an antenna duplexer.

A surface acoustic wave filter 50 according to Embodiment 4 differs from the surface acoustic wave filter 40 according to Embodiment 2 in that the surface acoustic wave resonators 131 and 116 are formed on one piezoelectric substrate 41, while the longitudinal coupled mode type surface acoustic wave filter 101 is formed on another piezoelectric substrate 42. Further, FIG. 19 is a block diagram of an antenna duplexer 60 that utilizes the surface acoustic wave filter 50.

When the surface acoustic wave resonators 131 and 116 are placed on one piezoelectric substrate 41, while the longitudinal coupled mode type surface acoustic wave filter 101 is installed on another piezoelectric substrate 42, as described above, the electrode material can be easily varied between the substrates. This simplifies a manufacturing process. For example, it is assumed that the electrodes of the surface acoustic wave resonators 131 and 116 are composed of a power durable material so as to have a stacked structure, while the electrodes of the longitudinal coupled mode type surface acoustic wave filter 101 are composed of a normal electrode material that does not resist power, as shown in Embodiment 3. Then, when these resonators and filter are installed on the same piezoelectric substrate, the manufacturing process becomes complicated to increase costs because different manufacturing processes must be used for the resonators and for the filter. However, by providing the piezoelectric substrate 41 using a power dulable material and the different piezoelectric substrate 42 using a normal material as described above, these units can each be manufactured using a simple manufacturing process. This reduces the whole manufacturing costs.

Furthermore, when different electrode film thicknesses are used for the surface acoustic wave resonators 116 and 131 and for the longitudinal coupled mode type surface acoustic wave filter 101, these resonators and filter can each be optimally designed.

In the above description, the surface acoustic wave resonators 131 and 116 are formed on the single piezoelectric substrate 41. However, these surface acoustic wave resonators may be produced on different piezoelectric substrates, respectively. In this case, the manufacturing process is further simplified if different electrode materials are used for the respective surface acoustic wave resonators.

Embodiment 5

Figure 20:
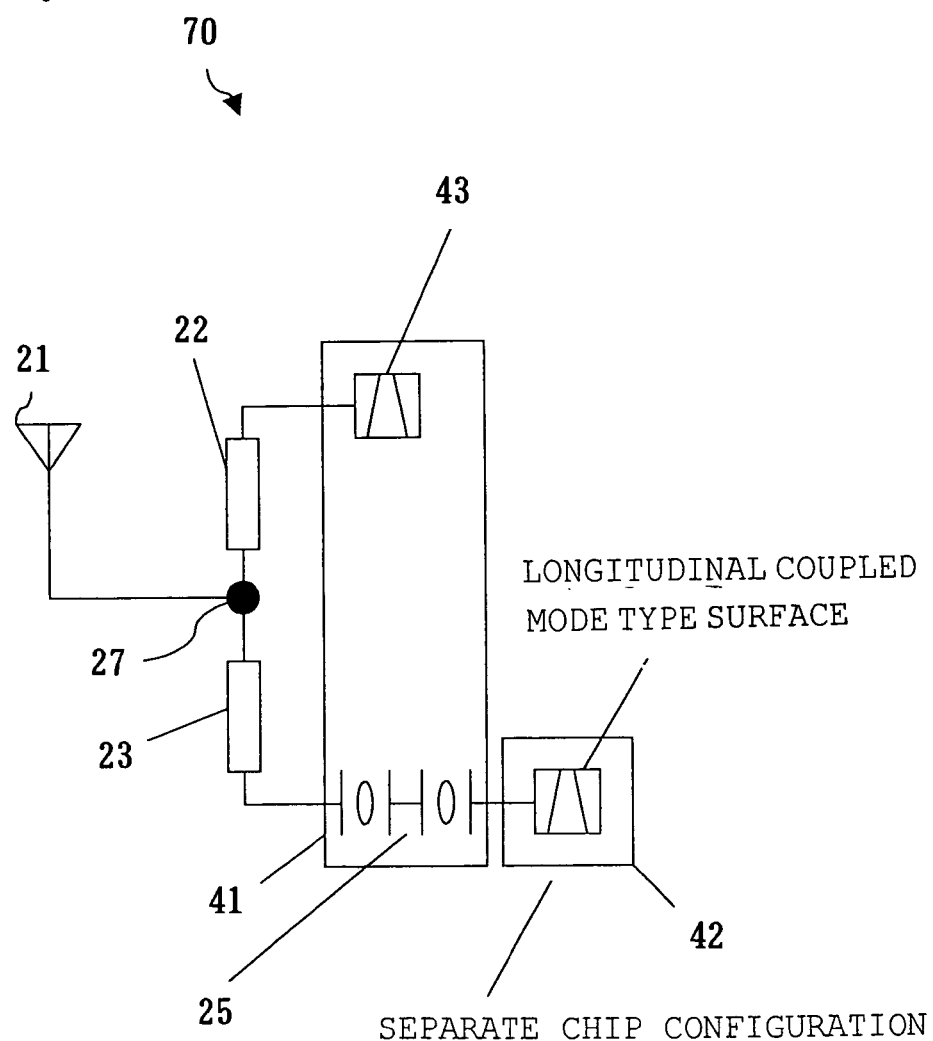
FIG. 20 is a block chart showing a configuration of an antenna duplexer according to Embodiment 5 of the present invention.

FIG. 20 shows an example of an antenna duplexer having a configuration different from that of the antenna duplexer shown in FIG. 19. An antenna duplexer 70, shown in FIG. 20, is characterized in that a transmission filter 43 is installed on the piezoelectric substrate 41 in which the surface acoustic wave resonators 131 and 116 having electrode portions composed of a power durable material are installed. The transmission filter 43 is desirably a surface acoustic wave filter.

By thus forming the transmission filter 43 on the same piezoelectric substrate 41, the size of the entire antenna duplexer 70 can be reduced. Further, in this case, when the electrodes of the transmission filter 43 are composed of the same power durable material as that used for the electrodes of the receiving surface acoustic wave resonators 131 and 116, the transmission filter and the receiving components can be produced during the same manufacturing process. This simplifies the manufacturing process for the entire antenna duplexer 70. As a result, manufacturing costs are reduced.

Further, when the originating transmission filter 43 and the components of the receiving surface acoustic wave resonators are produced during the same process, differences among the electrode materials can be suppressed. This improves the accuracy of manufacturing of the entire antenna duplexer 70: the filter and resonators can be manufactured so that, for example, the pass band of the transmission filter exactly coincides with the attenuation pole frequency of the reception filter.

Figure 21:
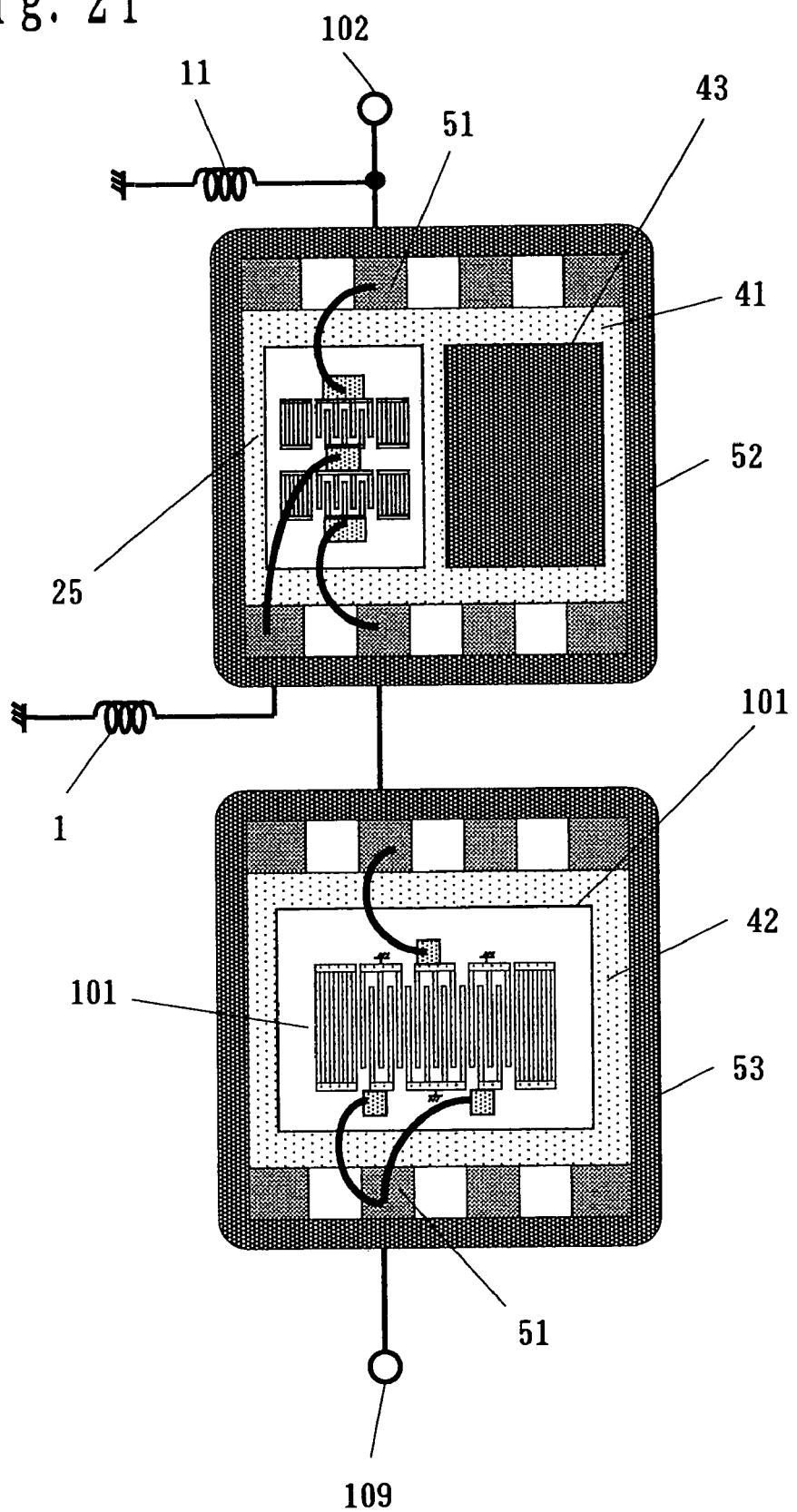
FIG. 21 is a plan sectional view showing a configuration of an antenna duplexer according to Embodiment 5 of the present invention.

FIG. 21 shows that Embodiment 5 of the present invention has actually been mounted in a package. The portions of an antenna duplexer according to Embodiment 5, shown in FIG. 20, are separately housed in a plurality of independent packages 52 and 53.

The piezoelectric substrate 41 is packaged in the package 52. The receiving resonator 25 and the originating transmission filter 43 are placed on the piezoelectric substrate 41. Each connection point is connected to an external electrode 51 using a wire or the like. The inductors 1 and 11 and the terminal 102 are connected via the corresponding external electrodes 51.

The receiving piezoelectric substrate 42 is packaged in the package 53. The receiving surface acoustic wave filter 101 is installed on the piezoelectric substrate 42. The external electrodes 51 of the package 53 and the terminal 109 are connected to the respective connection points via the corresponding external electrodes 51.

By thus packaging the receiving resonator 25 and the surface acoustic wave filter 101 in the different packages, the resonator and the filter can be isolated from each other. This eliminates unwanted electromagnetic coupling. Consequently, according to the antenna duplexer according to the present embodiment, on the receiving side, an excellent attenuation characteristic can be achieved in the transmission frequency band. Therefore, an accurate antenna duplexer can be provided.

In the package 52, at least one of the resonator 25 and the originating transmission filter 43 is mounted in a face down manner. Specifically, as shown in the schematic sectional view in FIG. 22(*a*), both the resonator 25 and the transmission filter 43 are mounted in a face down manner. Alternatively, as shown in the schematic sectional view in FIG. 22(*b*), one of the resonator 25 and the transmission filter 43 is mounted in a face down manner, while the other is mounted using wires. By thus mounting at least one of the resonator 25 and the originating transmission filter 43 in a face down manner, the isolation between the originating side and the receiving side can be prevented from being degraded owing to the spatial coupling of wires or the like.

Figure 22:
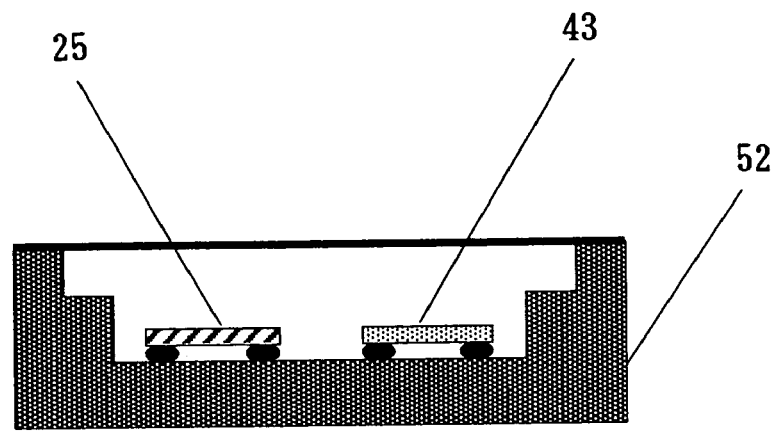
FIG. 22(a) is a schematic sectional view showing a configuration of an antenna duplexer according to Embodiment 5 of the present invention.
FIG. 22(b) is a schematic sectional view showing the configuration of the antenna duplexer according to Embodiment 5 of the present invention.
FIG. 22(c) is a schematic sectional view showing the configuration of the antenna duplexer according to Embodiment 5 of the present invention.
Figure 22:
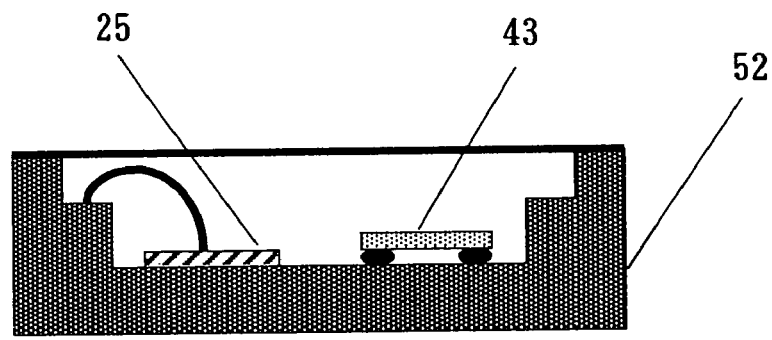
Figure 22:
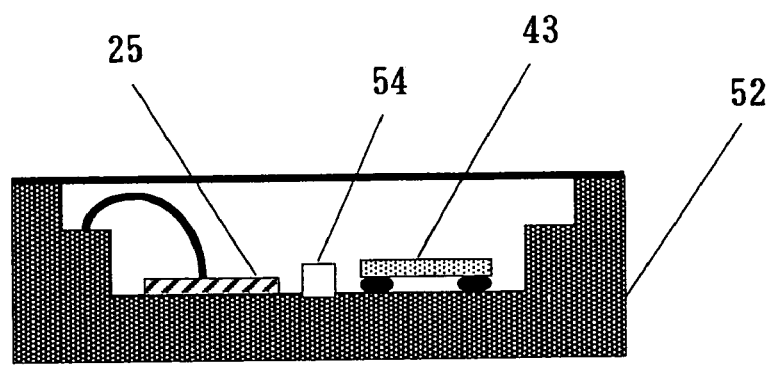
Figure 23:
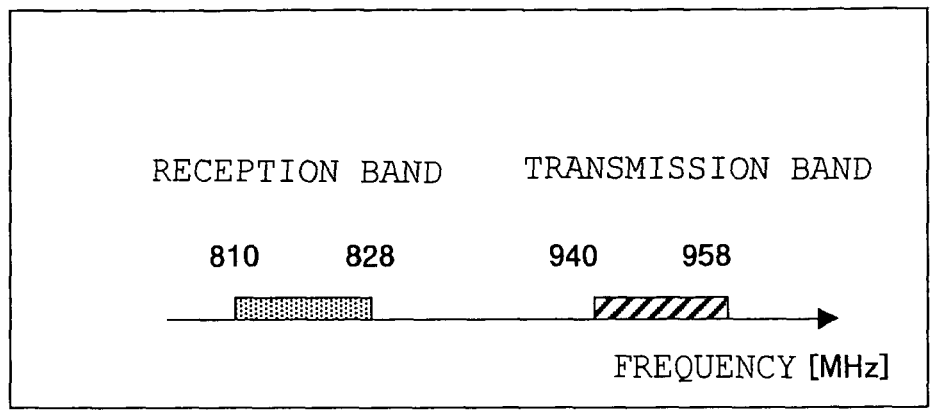
FIG. 23 is a chart showing a reception frequency band and a transmission frequency band in a PDC.
Figure 24:
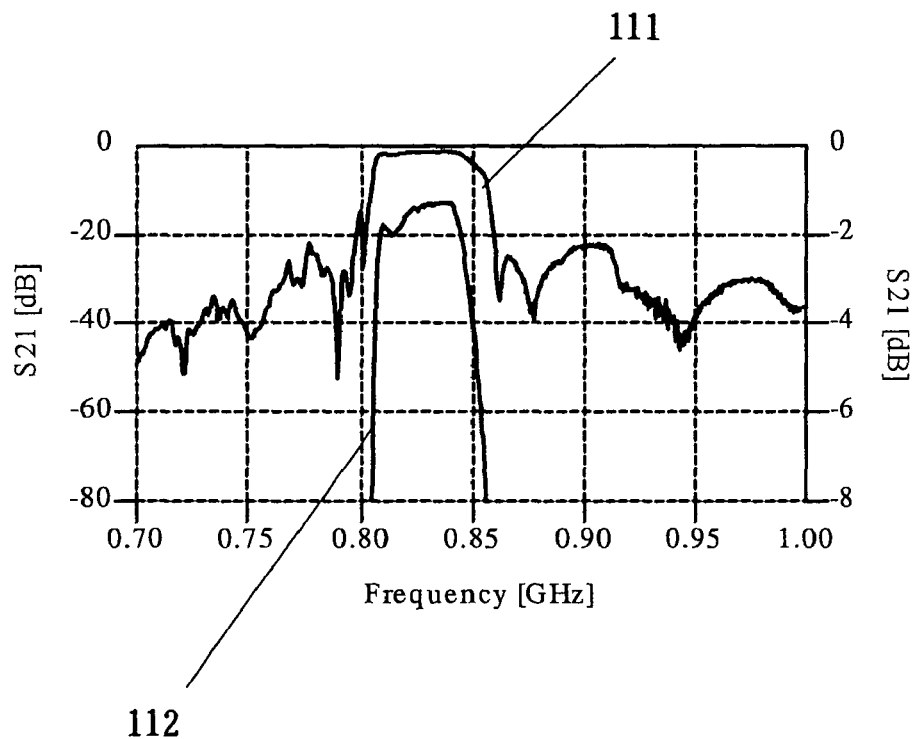
FIG. 24 is a chart showing the characteristics of a surface acoustic wave filter according to the prior art.
Figure 25:
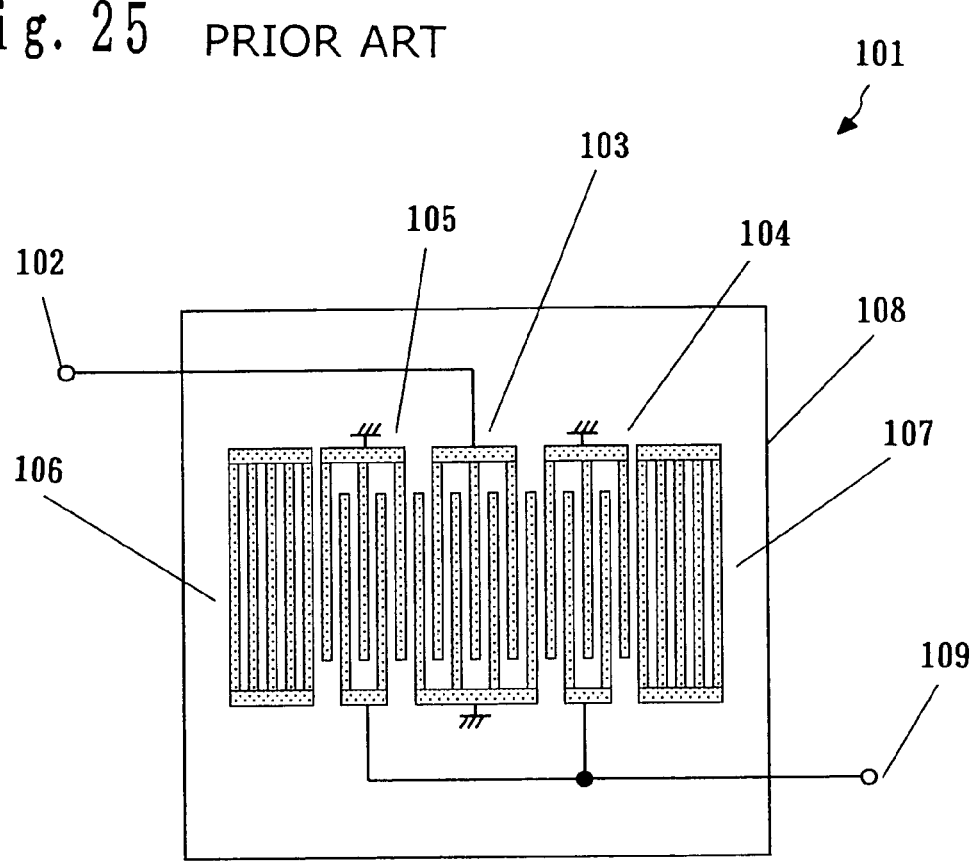
FIG. 25 is a plan view of the surface acoustic wave filter according to the prior art.
Figure 26:
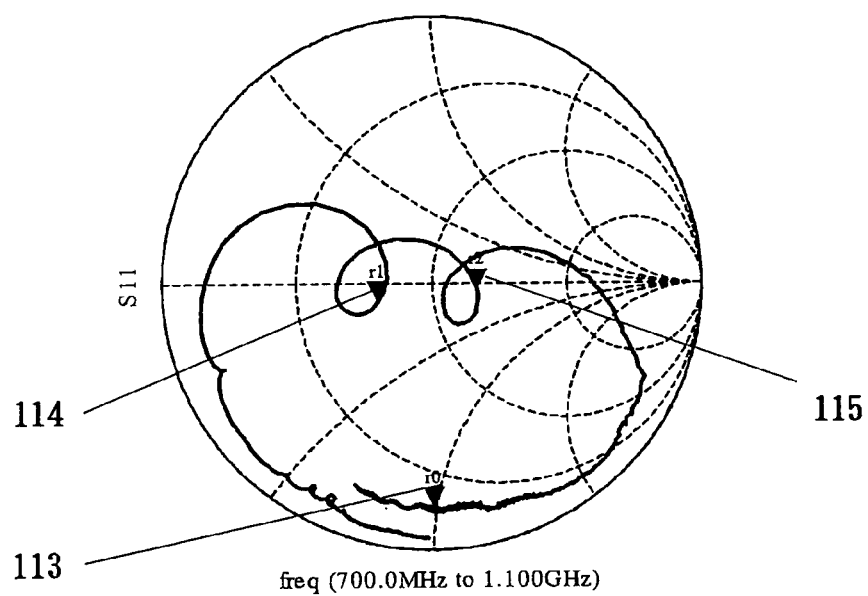
FIG. 26 is a chart showing the characteristics of the surface acoustic wave filter according to the prior art.

In this case, if one of the resonator and the filter is mounted in a face down manner, while the other is mounted face up for wire connection, a barrier wall 54 is desirably installed between the resonator 25 and the originating transmission filter 43 as shown in the schematic sectional view in FIG. 22(*c*). The barrier wall 54 can prevent resin used to fix the wires from flowing into a face down mounting surface during wire mounting. Further, in this case, the face down mounting desirably precedes the wire mounting.

Further, in the description of the present embodiment, the receiving resonator 25 and the originating transmission filter 43 are installed on the same piezoelectric substrate 41. However, the resonator 25 and the transmission filter 43 may be formed on different piezoelectric substrates within the same package 52. Also in this case, unwanted electromagnetic coupling can be eliminated. Thus, effects similar to those described above can be produced.

In the above description, the reception and transmission frequency bands in the PDC system are assumed for the surface acoustic wave filter and antenna duplexer according to the present invention. However, it is contemplated that the present invention may be used in a system other than the PDC system. Further, the surface acoustic wave filter according to the present invention is applicable even if the relationship between the originating frequency and the receiving frequency is reversed.

Furthermore, the scope of the present invention includes communication equipment comprising the antenna duplexer described above, transmission means connected to the antenna duplexer to transmit transmission signals, and reception means connected to the antenna duplexer to receive reception signals.

The surface acoustic wave filter and others according to the present invention are applicable to, for example, a use for a surface acoustic wave filter that reduces ripples in the reception frequency band while ensuring sufficient attenuation in the transmission frequency band.

What is claimed is:

1. An antenna duplexer, comprising:
   an antenna terminal;
   a reception filter connected to said antenna terminal;
   a transmission filter connected to said antenna terminal; and
   a first phase circuit provided between said antenna terminal and said reception filter and/or a second phase circuit provided between said antenna terminal and said transmission filter,
   wherein said reception filter is a surface acoustic wave filter, comprising:
   at least one piezoelectric substrate;
   at least one surface acoustic wave resonator formed on said piezoelectric substrate; and
   a longitudinal coupled mode type surface acoustic wave filter formed on said piezoelectric substrate, wherein said surface acoustic wave resonator and said longitudinal coupled mode type surface acoustic wave filter are cascaded together, wherein said surface acoustic wave resonator is also connected to at least one inductor having one end grounded, and wherein an attenuation band of said at least one surface acoustic wave resonator is apart from a pass band of said longitudinal coupled mode type surface acoustic wave filter in the direction of higher frequencies.

2. A surface acoustic wave filter, comprising:
at least one piezoelectric substrate;
at least one surface acoustic wave resonator formed on said piezoelectric substrate; and
a longitudinal coupled mode type surface acoustic wave filter formed on said piezoelectric substrate,
wherein different electrode materials are used for said at least one surface acoustic wave resonator and for said longitudinal coupled mode type surface acoustic wave filter, respectively,
wherein said surface acoustic wave resonator and said longitudinal coupled mode type surface acoustic wave filter are cascaded together, and
wherein said surface acoustic wave resonator is also connected to at least one inductor having one end grounded.

3. The surface acoustic wave filter according to claim 2, wherein the electrode material of said at least one surface acoustic wave resonator has a stronger power durability than the electrode material of said longitudinal coupled mode type surface acoustic wave filter.

4. The surface acoustic wave filter according to claim 3, wherein said at least one surface acoustic wave resonator has a laminated electrode configuration.

5. The surface acoustic wave filter according to claim 2, wherein the other end of said inductor is connected to a connection portion between said surface acoustic wave resonator and said longitudinal coupled mode type surface acoustic wave filter.

6. The surface acoustic wave filter according to claim 2, wherein the attenuation band of said at least one surface acoustic wave resonator is set to be higher than the pass band of said longitudinal coupled mode type surface acoustic wave filter.

7. The surface acoustic wave filter according to claim 2, wherein the other end of said inductor is connected to a side of said surface acoustic wave resonator which is opposite said longitudinal coupled mode type surface acoustic wave filter.

8. The surface acoustic wave filter according to claim 7, wherein a plurality of said surface acoustic wave resonators are cascaded together, and
wherein the side of said surface acoustic wave resonator which is opposite the longitudinal coupled mode type surface acoustic wave filter includes connection portions between said plurality of cascaded surface acoustic wave resonators.

9. The surface acoustic wave filter according to claim 8, wherein a plurality of said inductors are provided, and each inductor is connected to said surface acoustic wave resonator through respective different connection portions.

10. The surface acoustic wave filter according to claim 9, wherein at least one inductor, as one of said plurality of said inductors, is provided between said plurality of cascaded surface acoustic wave resonators.

11. The surface acoustic wave filter according to claim 2, wherein said inductor moves a phase of an impedance at a frequency of said attenuation band closer to its open state.

12. The surface acoustic wave filter according to claim 11, wherein said inductor matches impedances at a frequency of said pass band to each other.

13. The surface acoustic wave filter according to claim 2, wherein different electrode film thicknesses are used for said at least one surface acoustic wave resonator and for said longitudinal coupled mode type surface acoustic wave filter.

14. The surface acoustic wave filter according to claim 2, wherein a plurality of piezoelectric substrates are provided as said at least one piezolectric substrate, and
wherein the piezoelectric substrate on which said at least one surface acoustic wave resonator is formed is different from the piezoelectric substrate on which said longitudinal coupled mode type surface acoustic wave filter is formed.

15. The surface acoustic wave filter according to claim 14, wherein at least one of said at least one surface acoustic wave resonator and said longitudinal coupled mode type surface acoustic wave filter is mounted in a face down manner.

16. The surface acoustic wave filter according to claim 15, wherein the other of said at least one surface acoustic wave resonator and said longitudinal coupled mode type surface acoustic wave filter is mounted using wires.

17. An antenna duplexer, comprising:
an antenna terminal;
a reception filter connected to said antenna terminal;
a transmission filter connected to said antenna terminal; and
a first phase circuit provided between said antenna terminal and said reception filter and/or a second phase circuit provided between said antenna terminal and said transmission filter, wherein the surface acoustic wave filter according to claim 2 is used as said reception filter.

18. The antenna duplexer according to claim 17 or 2, wherein all or part of said transmission filter is composed of a surface acoustic wave filter formed on a piezoelectric substrate.

19. Communication equipment comprising:
an antenna duplexer according to claim 18;
an antenna connected to said antenna duplexer;
transmission means connected to said antenna duplexer of transmitting a signal via said antenna; and
reception means connected to said antenna duplexer of receiving a signal via said antenna.

20. The antenna duplexer according to claim 18, wherein said transmission filter is formed on the same piezoelectric substrate on which said surface acoustic wave resonator of said surface acoustic wave filter used as said reception filter is formed.

21. The antenna duplexer according to claim 18, wherein said at least one surface acoustic wave resonator and said transmission filter are mounted on the same package or the same mounting substrate, and said longitudinal coupled mode type surface acoustic wave filter is mounted on a package or mounting substrate different from said package or mounting substrate.

22. The antenna duplexer according to claim 18, wherein the surface acoustic wave resonator of said surface acoustic wave filter used as said reception filter and said transmission filter are formed on different piezoelectric substrates, and at least one of said surface acoustic wave resonator and said transmission filter is mounted in a face down manner.

23. The antenna duplexer according to claim 22, wherein one of said surface acoustic wave resonator and said transmission filter is mounted in a face down manner, and the other is mounted face up for wire connection.

24. The antenna duplexer according to claim 18, wherein a barrier is provided at a boundary between two areas of the package or mounting substrate on which said surface acoustic wave resonator of said surface acoustic wave filter used as said reception filter and said transmission filter are mounted, said surface acoustic wave resonator being mounted in one of the areas, said transmission filter being mounted in the other area.

25. A surface acoustic wave filter, comprising:
   at least one piezoelectric substrate;
   at least one surface acoustic wave resonator formed on said piezoelectric substrate; and
   a longitudinal coupled mode type surface acoustic wave filter formed on said piezoelectric substrate,
   wherein said surface acoustic wave resonator and said longitudinal coupled mode type surface acoustic wave filter are cascaded together,
   wherein said surface acoustic wave resonator is also connected to at least one inductor having one end grounded, and
   wherein an attenuation band of said at least one surface acoustic wave resonator is apart from a pass band of said longitudinal coupled mode type surface acoustic wave filter in the direction of higher frequencies, and
   wherein said inductor moves a phase of an impedance at a frequency of said attenuation band closer to its open state.

26. A surface acoustic wave filter, comprising:
   at least one piezoelectric substrate;
   at least one surface acoustic wave resonator formed on said piezoelectric substrate; and
   a longitudinal coupled mode type surface acoustic wave filter formed on said piezoelectric substrate,
   wherein said surface acoustic wave resonator and said longitudinal coupled mode type surface acoustic wave filter are cascaded together,
   wherein said surface acoustic wave resonator is also connected to at least one inductor having one end grounded,
   wherein an attenuation band of said at least one surface acoustic wave resonator is apart from a pass band of said longitudinal coupled mode type surface acoustic wave filter in the direction of higher frequencies, and
   wherein the other end of said inductor is connected to a side of said surface acoustic wave resonator which is opposite said longitudinal coupled mode type surface acoustic wave filter.

27. A surface acoustic wave filter, comprising:
   at least one piezoelectric substrate;
   at least one surface acoustic wave resonator formed on said piezoelectric substrate; and
   a longitudinal coupled mode type surface acoustic wave filter formed on said piezoelectric substrate,
   wherein said surface acoustic wave resonator and said longitudinal coupled mode type surface acoustic wave filter are cascaded together,
   wherein said surface acoustic wave resonator is also connected to at least one inductor having one end that is connected directly to ground, and
   wherein an attenuation band of said at least one surface acoustic wave resonator is apart from a pass band of said longitudinal coupled mode type surface acoustic wave filter in the direction of higher frequencies, and
   wherein the other end of said inductor is connected directly to a connection portion between said surface acoustic wave resonator and said longitudinal coupled mode type surface acoustic wave filter.

* * * * *